(12) United States Patent
Honda

(10) Patent No.: US 10,976,665 B2
(45) Date of Patent: Apr. 13, 2021

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventor: Yoshiyuki Honda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/989,328

(22) Filed: Aug. 10, 2020

(65) Prior Publication Data

US 2020/0371442 A1   Nov. 26, 2020

Related U.S. Application Data

(63) Continuation of application No. PCT/JP2018/013331, filed on Mar. 29, 2018.

(51) Int. Cl.
*G03F 7/20* (2006.01)
*G02B 1/14* (2015.01)
(Continued)

(52) U.S. Cl.
CPC ........... *G03F 7/70033* (2013.01); *G02B 1/14* (2015.01); *G02B 5/0891* (2013.01); *G03F 7/702* (2013.01);
(Continued)

(58) Field of Classification Search
CPC ........ G03F 7/20; G03F 7/70033; G03F 7/702; G03F 7/70175; G03F 7/70916;
(Continued)

(56) References Cited

U.S. PATENT DOCUMENTS

2005/0244572 A1* 11/2005 Bristol ............... G03F 7/70175
427/162
2009/0250641 A1* 10/2009 Moriya ............... G03F 7/70916
250/504 R
(Continued)

FOREIGN PATENT DOCUMENTS

JP   2007-127698 A   5/2007
JP   2008-288299 A   11/2008
(Continued)

OTHER PUBLICATIONS

International Search Report issued in PCT/JP2018/013331; dated Jun. 19, 2018.
(Continued)

*Primary Examiner* — Christina A Riddle
(74) *Attorney, Agent, or Firm* — Studebaker & Brackett PC

(57) ABSTRACT

An extreme ultraviolet light generation apparatus includes: a chamber having an internal space in which a laser beam is condensed and plasma generation occurs at a focusing position of the laser beam; a condensing mirror configured to condense extreme ultraviolet light generated through the plasma generation; and a magnetic field generation unit configured to generate a magnetic field. The condensing mirror includes a substrate, a reflective layer, and a protective layer. The protective layer includes a first protective layer disposed in a first region, and a second protective layer disposed in a second region. A material of the first protective layer is less dense than a material of the second protective layer. The material of the second protective layer has a transmittance for the extreme ultraviolet light higher than that of the material of the first protective layer.

20 Claims, 16 Drawing Sheets

(51) Int. Cl.
*G02B 5/08* (2006.01)
*H05G 2/00* (2006.01)

(52) U.S. Cl.
CPC ...... *G03F 7/70175* (2013.01); *G03F 7/70916* (2013.01); *G03F 7/70958* (2013.01); *H05G 2/008* (2013.01)

(58) Field of Classification Search
CPC ............. G03F 7/70883; G03F 7/70891; G03F 7/7095; G03F 7/70958; G03F 7/7015; G03F 7/70191; G03F 7/70858; G03F 7/70908–70958; G03F 7/70983; H05G 2/00–008; G02B 1/14; G02B 5/0891; G02B 5/08; G21K 2201/067

USPC ............ 355/30, 52–55, 60, 66, 72–77; 250/492.1, 492.2, 492.22, 493.1, 494.1, 250/504 R

See application file for complete search history.

(56) References Cited

U.S. PATENT DOCUMENTS

| 2010/0284511 | A1* | 11/2010 | Zocchi ................ G02B 5/0891 378/34 |
| 2012/0188522 | A1 | 7/2012 | Silova |
| 2013/0126762 | A1 | 5/2013 | Moriya et al. |
| 2014/0078486 | A1* | 3/2014 | Yakunin .............. G03F 7/70058 355/71 |
| 2014/0098413 | A1 | 4/2014 | Ershov et al. |
| 2014/0104587 | A1 | 4/2014 | Freimann et al. |
| 2017/0205704 | A1 | 7/2017 | Nikipelov et al. |
| 2020/0077501 | A1* | 3/2020 | Tomuro ................. H05G 2/008 |
| 2020/0209755 | A1* | 7/2020 | Honda ................... G21K 1/062 |

FOREIGN PATENT DOCUMENTS

| JP | 2009-253032 A | 10/2009 |
| JP | 2012-156506 A | 8/2012 |
| JP | 2015-533253 A | 11/2015 |

OTHER PUBLICATIONS

Written Opinion issued in PCT/JP2018/013331; dated Jun. 19, 2018.

\* cited by examiner

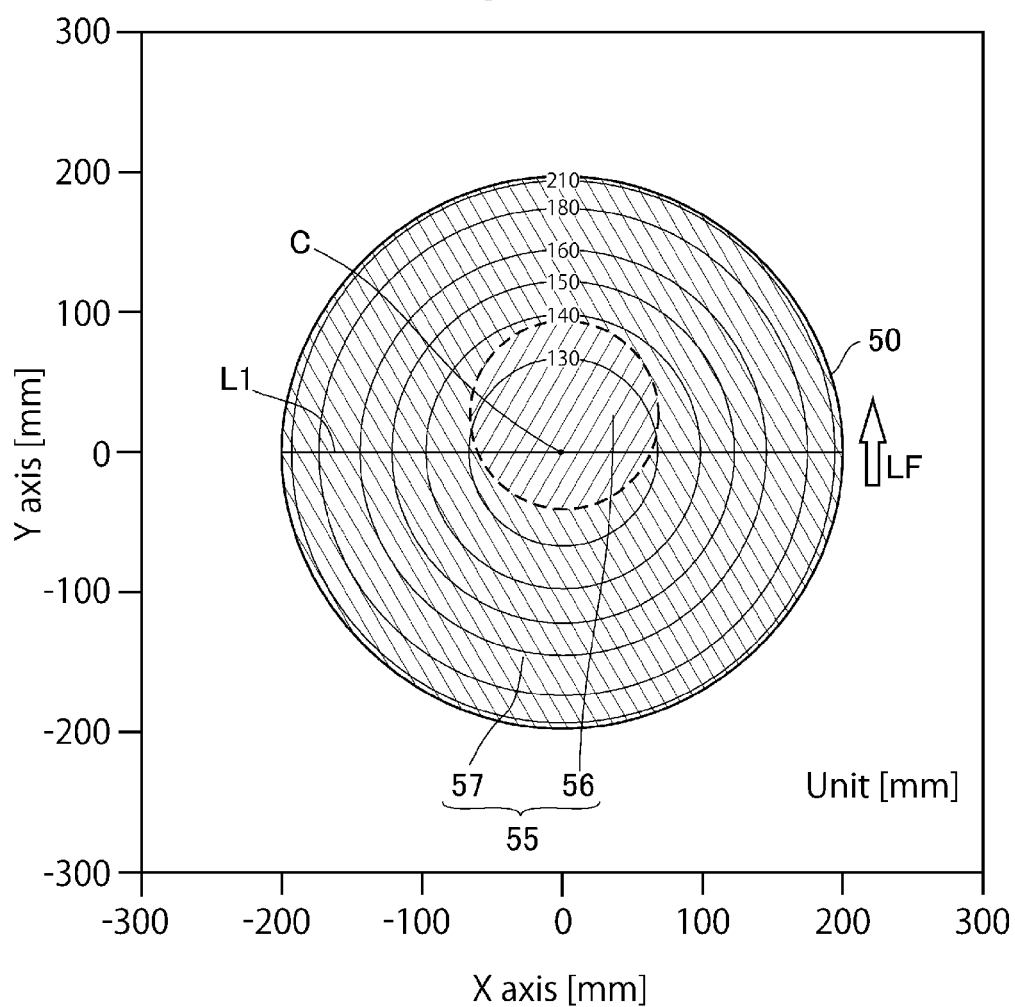

EXTREME ULTRAVIOLET LIGHT GENERATION APPARATUS AND ELECTRONIC DEVICE MANUFACTURING METHOD

CROSS-REFERENCE TO RELATED APPLICATIONS

The present application is a continuation application of International Application No. PCT/JP2018/013331 filed on Mar. 29, 2018. The content of the application is incorporated herein by reference in its entirety.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: US Published Patent Application No. 2017/0205704
Patent Document 2: Japanese Unexamined Patent Application Publication No. 2007-127698
Patent Document 3: US Published Patent Application No. 2014/0104587

SUMMARY

An extreme ultraviolet light generation apparatus according to an aspect of the present disclosure includes a chamber having an internal space in which a laser beam is condensed and plasma is generated from a target substance at a focusing position of the laser beam, a condensing mirror configured to condense extreme ultraviolet light generated through the plasma generation from the target substance, and a magnetic field generation unit configured to generate a magnetic field having a magnetic field axis intersecting a reflected light path of the condensing mirror. The condensing mirror may include a substrate, a reflective layer provided on the substrate to reflect the extreme ultraviolet light, and a protective layer provided on the reflective layer. The protective layer may include a first protective layer disposed in a first region including at least part of a line extending through a center of the condensing mirror along the magnetic field axis on a surface of the reflective layer, and a second protective layer disposed in a second region other than the first region on the surface of the reflective layer. A material of the first protective layer may be less dense than a material of the second protective layer. The material of the second protective layer may have a transmittance for the extreme ultraviolet light higher than a transmittance for the extreme ultraviolet light of the material of the first protective layer.

An extreme ultraviolet light generation apparatus according to another aspect of the present disclosure includes a chamber having an internal space in which a laser beam is condensed and plasma is generated from a target substance at a focusing position of the laser beam, and a condensing mirror configured to condense extreme ultraviolet light generated through the plasma generation from the target substance. The condensing mirror may include a substrate, a reflective layer provided on the substrate to reflect the extreme ultraviolet light, and a protective layer provided on the reflective layer. The protective layer may include a first protective layer disposed in a first region within a predetermined range from a center of the condensing mirror, and a second protective layer disposed in a second region other than the first region on the surface of the reflective layer. A material of the first protective layer may be less dense than a material of the second protective layer. The second protective layer may have a transmittance for the extreme ultraviolet light higher than a transmittance for the extreme ultraviolet light of the first protective layer.

An electronic device manufacturing method according to another aspect of the present disclosure includes generating extreme ultraviolet light with an extreme ultraviolet light generation apparatus, outputting the extreme ultraviolet light to an exposure apparatus, and exposing a photosensitive substrate to the extreme ultraviolet light in the exposure apparatus to manufacture an electronic device. The extreme ultraviolet light generation apparatus may include a chamber having an internal space in which a laser beam is condensed and plasma is generated from a target substance at a focusing position of the laser beam, a condensing mirror configured to condense extreme ultraviolet light generated through the plasma generation from the target substance, and a magnetic field generation unit configured to generate a magnetic field having a magnetic field axis intersecting a reflected light path of the condensing mirror. The condensing mirror may include a substrate, a reflective layer provided on the substrate to reflect the extreme ultraviolet light, and a protective layer provided on the reflective layer. The protective layer may include a first protective layer disposed in a first region including at least part of a line extending through a center of the condensing mirror along the magnetic field axis on a surface of the reflective layer, and a second protective layer disposed in a second region other than the first region on the surface of the reflective layer. A material of the first protective layer may be less dense than a material of the second protective layer. The second protective layer may have a transmittance for the extreme ultraviolet light higher than a transmittance for the extreme ultraviolet light of the first protective layer.

An electronic device manufacturing method according to another aspect of the present disclosure includes generating extreme ultraviolet light with an extreme ultraviolet light generation apparatus, outputting the extreme ultraviolet light to an exposure apparatus, and exposing a photosensitive substrate to the extreme ultraviolet light in the exposure apparatus to manufacture an electronic device. The extreme ultraviolet light generation apparatus may include a chamber having an internal space in which a laser beam is condensed and plasma is generated from a target substance at a focusing position of the laser beam, and a condensing mirror configured to condense extreme ultraviolet light generated through the plasma generation from the target substance. The condensing mirror may include a substrate, a reflective layer provided on the substrate to reflect the extreme ultraviolet light, and a protective layer provided on the reflective layer. The protective layer may include a first protective layer disposed in a first region within a predetermined range from a center of the condensing mirror, and a second protective layer disposed in a second region other than the first region on the surface of the reflective layer. A material of the first protective layer may be less dense than a material of the second protective layer. The second protective layer may have a transmittance for the extreme ultraviolet light higher than a transmittance for the extreme ultraviolet light of the first protective layer.

BRIEF DESCRIPTION OF THE DRAWINGS

Embodiments of the present disclosure will be described below as examples with reference to the accompanying drawings.

FIG. 20 is a diagram illustrating distribution of the distance between the surface of the reflective layer and the focusing position of a laser beam, and the status of the protective layer of the extreme ultraviolet light condensing mirror of Embodiment 8.

DESCRIPTION OF EMBODIMENTS

1. Overview
2. Description of electronic device manufacturing device
3. Description of extreme ultraviolet light generation apparatus
   3.1 Configuration
   3.2 Operation
4. Description of EUV light condensing mirror of comparative example
   4.1 Configuration
   4.2 Problem
5. Description of EUV light condensing mirror of Embodiment 1
   5.1 Configuration
   5.2 Effect 6. Description of EUV light condensing mirror of Embodiment 2
   6.1 Configuration
   6.2 Effect
7. Description of EUV light condensing mirror of Embodiment 3
   7.1 Configuration
   7.2 Effect
8. Description of EUV light condensing mirror of Embodiment 4
   8.1 Configuration
   8.2 Effect
9. Description of EUV light condensing mirror of Embodiment 5
   9.1 Configuration
   9.2 Effect
10. Description of EUV light condensing mirror of Embodiment 6
   10.1 Configuration
   10.2 Effect
11. Description of EUV light condensing mirror of Embodiment 7
   11.1 Configuration
   11.2 Effect
12. Description of EUV light condensing mirror of Embodiment 8
   12.1 Configuration
   12.2 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

1. Overview

Embodiments of the present disclosure relate to an extreme ultraviolet light generation apparatus and an electronic device manufacturing device that generate light having a wavelength corresponding to so-called extreme ultraviolet (EUV). In the present specification, extreme ultraviolet light is also referred to as EUV light.

2. Description of Electronic Device Manufacturing Device

Figure 1:
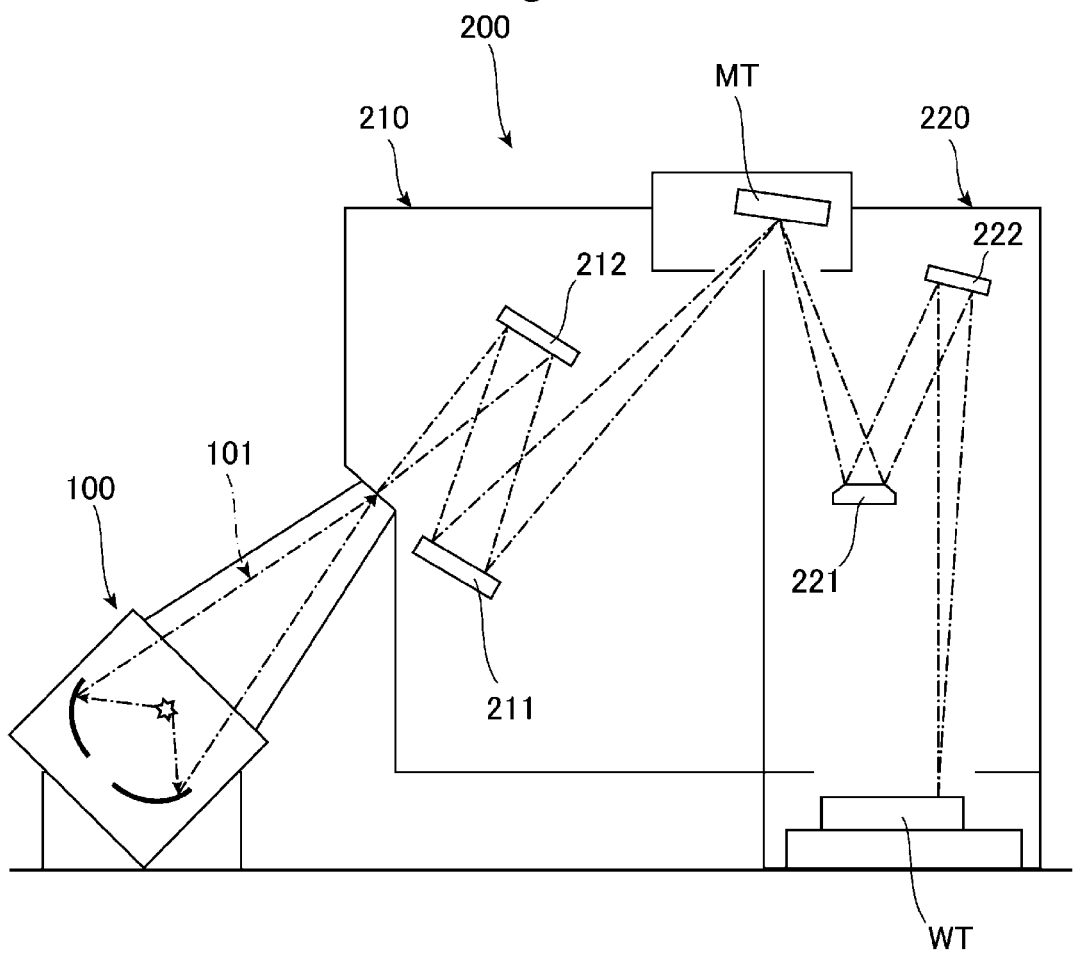
FIG. 1 is a pattern diagram illustrating an exemplary entire schematic configuration of an electronic device manufacturing device.

As illustrated in FIG. 1, the electronic device manufacturing device includes an EUV light generation apparatus 100 and an exposure apparatus 200. The exposure apparatus 200 includes a mask irradiation unit 210 including a plurality of mirrors 211 and 212, and a workpiece irradiation unit 220 including a plurality of mirrors 221 and 222. The mask irradiation unit 210 causes EUV light 101 incident from the EUV light generation apparatus 100 to be incident on a mask pattern on a mask table MT through a reflection optical system. The workpiece irradiation unit 220 causes the EUV light 101 reflected by the mask table MT to be imaged on a workpiece (not illustrated) disposed on a workpiece table WT through a reflected optical system. The workpiece is a photosensitive substrate such as a semiconductor wafer to which photoresist is applied. The exposure apparatus 200 translates the mask table MT and the workpiece table WT in synchronization to expose the workpiece to the EUV light 101 reflected by the mask pattern. Through an exposure process as described above, a device pattern can be transferred onto the semiconductor wafer to manufacture a semiconductor device.

3. Description of Extreme Ultraviolet Light Generation Apparatus

3.1 Configuration

Figure 2:
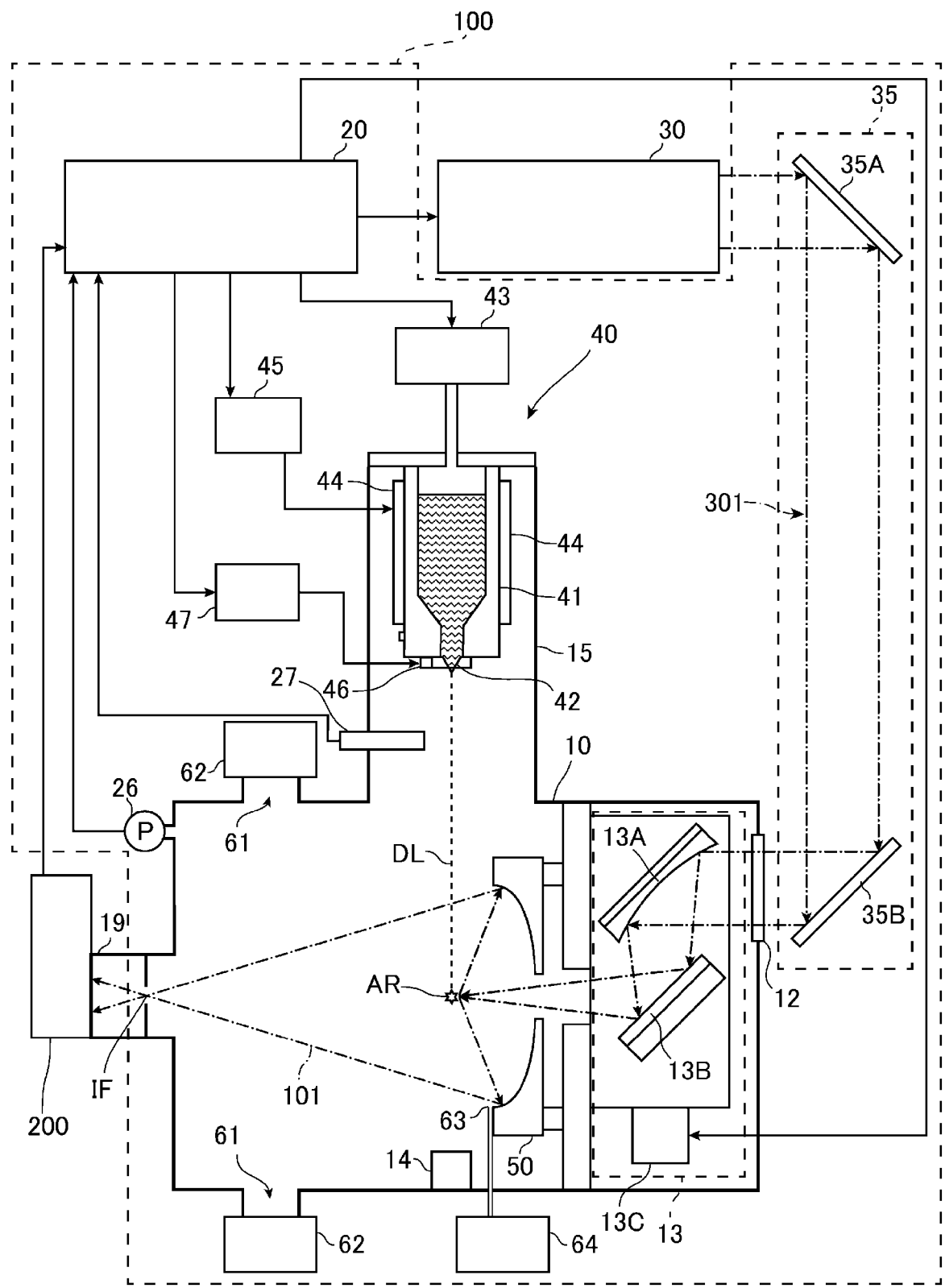
FIG. 2 is a pattern diagram illustrating an exemplary entire schematic configuration of an extreme ultraviolet light generation apparatus.

FIG. 2 is a pattern diagram illustrating an exemplary entire schematic configuration of the extreme ultraviolet light generation apparatus of the present example. As illustrated in FIG. 2, the EUV light generation apparatus 100 of the present embodiment is connected with a laser apparatus 30. The EUV light generation apparatus 100 of the present embodiment includes a chamber 10, a control unit 20, and a laser beam delivery optical system 35.

The chamber 10 is a sealable container. The chamber 10 is provided continuously with a sub chamber 15, and the sub chamber 15 is provided with a target supply unit 40. The target supply unit 40 includes a tank 41 and a nozzle 42. The target supply unit 40 supplies a droplet DL to the internal space of the chamber 10 and is attached to, for example, penetrate through a wall of the sub chamber 15. The droplet DL is also referred to as a target and supplied from the target supply unit 40.

The tank 41 stores inside a target substance that becomes the droplet DL. The target substance may contain any of tin, terbium, gadolinium, lithium, xenon, or combination of any two or more of the materials, but is not limited thereto. The inside of the tank 41 is communicated, through a pipe, with a pressure adjuster 43 configured to adjust gas pressure. In addition, a heater 44 is attached to the tank 41. The heater 44 heats the tank 41 by current supplied from a heater power source 45. Through the heating, the target substance in the tank 41 melts. The pressure adjuster 43 and the heater power source 45 are connected with the control unit 20.

The nozzle 42 is attached to the tank 41 and discharges the target substance. A piezoelectric element 46 is attached to the nozzle 42. The piezoelectric element 46 is connected with a piezoelectric power source 47 and driven by voltage applied from the piezoelectric power source 47. The piezoelectric power source 47 is connected with the control unit 20. Through operation of the piezoelectric element 46, the target substance discharged from the nozzle 42 is separated and formed into the droplet DL.

The chamber 10 also includes a target collection unit 14. The target collection unit 14 collects unnecessary droplets DL.

The wall of the chamber 10 is provided with at least one through-hole. The through-hole is blocked by a window 12 through which a laser beam 301 emitted in pulses from the laser apparatus 30 transmits. For example, an EUV light condensing mirror 50 having a reflective surface in a spheroid shape is disposed inside the chamber 10. The EUV light condensing mirror 50 has first and second focal points. The EUV light condensing mirror 50 may be disposed so that, for example, the first focal point is positioned in a plasma generation region AR and the second focal point is positioned at an intermediate focus point IF. A through-hole is provided at a central part of the EUV light condensing mirror 50, and the laser beam 301 in pulses passes through the through-hole.

The EUV light generation apparatus 100 also includes a connection unit 19 that provides communication between the internal space of the chamber 10 and the internal space of the exposure apparatus 200. A wall through which an aperture is formed is provided inside the connection unit 19. The wall is preferably disposed so that the aperture is positioned at the second focal point position of the EUV light condensing mirror 50.

The EUV light generation apparatus 100 also includes a pressure sensor 26. The pressure sensor 26 measures the pressure of the internal space of the chamber 10. The EUV light generation apparatus 100 also includes a target sensor 27 attached to the chamber 10. The target sensor 27 has, for example, an image capturing function and detects the existence, locus, position, speed, and the like of the droplet DL. The pressure sensor 26 and the target sensor 27 are connected with the control unit 20.

In addition, a laser condensing optical system 13 is disposed in the chamber 10. The laser condensing optical system 13 includes a laser beam condensing mirror 13A and a high reflectance mirror 13B. The laser beam condensing mirror 13A reflects and condenses the laser beam 301 transmitting through the window 12. The high reflectance mirror 13B reflects light condensed by the laser beam condensing mirror 13A. The positions of the laser beam condensing mirror 13A and the high reflectance mirror 13B are adjusted by a laser beam manipulator 13C so that a laser focusing position in the chamber 10 coincides with a position specified by the control unit 20.

The traveling direction of the laser beam 301 emitted from the laser apparatus 30 is adjusted through the laser beam delivery optical system 35. The laser beam delivery optical system 35 includes a plurality of mirrors 35A and 35B for adjusting the traveling direction of the laser beam 301, and the position of at least part of the mirrors 35A and 35B is adjusted by an actuator (not illustrated).

The laser apparatus 30 includes a master oscillator as a light source configured to perform burst operation. The master oscillator emits the laser beam 301 in pulses in a burst-on duration. The master oscillator is, for example, a laser apparatus configured to emit a laser beam by exciting, through electrical discharging, gas as mixture of carbon dioxide gas with helium, nitrogen, or the like. Alternatively, the master oscillator may be a quantum cascade laser apparatus. The master oscillator may emit the laser beam 301 in pulses by a Q switch scheme. The master oscillator may include a light switch, a polarizer, and the like. In the burst operation, the laser beam is emitted in continuous pulses at a predetermined repetition frequency in a burst-on duration and the emission of the laser beam 301 is stopped in a burst-off duration.

The control unit 20 is a computer including a central processing unit (CPU) and the like. The control unit 20 controls the entire EUV light generation apparatus 100 and also controls the laser apparatus 30. The control unit 20 receives, for example, a signal related to the pressure of the internal space of the chamber 10, which is measured by the pressure sensor 26, a signal related to image data of the droplet DL, which is captured by the target sensor 27, and a burst signal from the exposure apparatus 200. The control unit 20 processes the image data and the like and controls the output timing of the droplet DL, the output direction of the droplet DL, and the like. These various kinds of control are merely exemplary and may include other control as described later.

The following describes the configuration of the chamber 10 in more detail.

Figure 3:
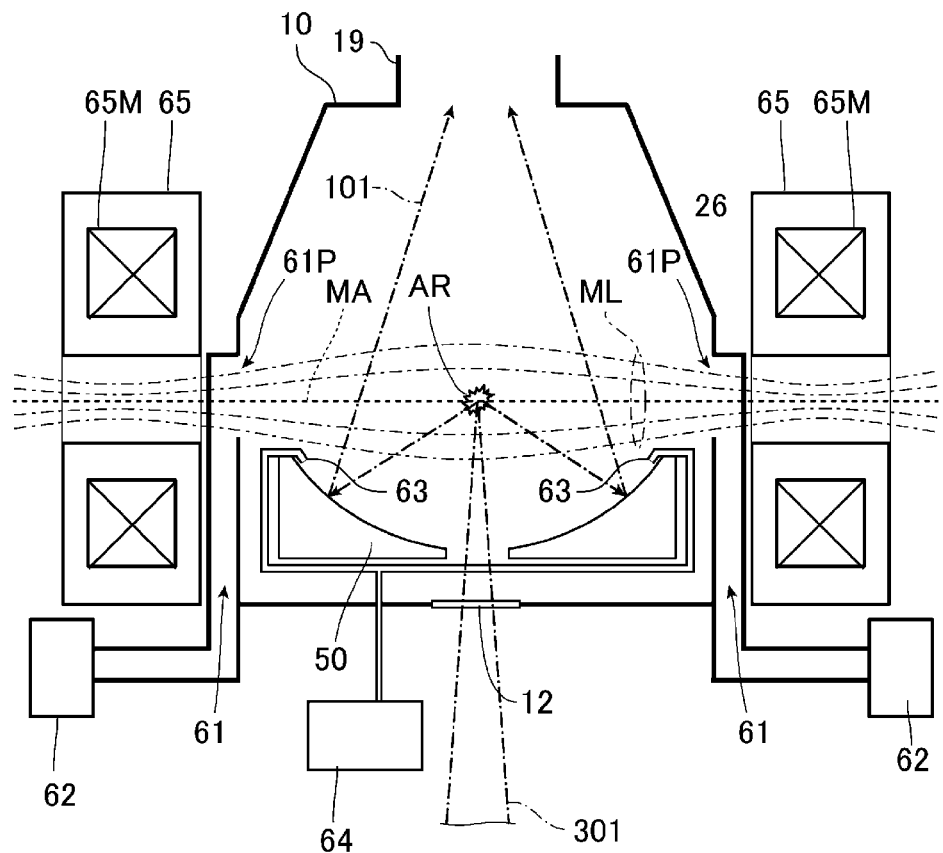
FIG. 3 is a pattern diagram illustrating a schematic configuration of a part including a chamber in the extreme ultraviolet light generation apparatus.

FIG. 3 is a pattern diagram illustrating a schematic configuration of a part including the chamber 10 in the EUV light generation apparatus 100. As illustrated in FIGS. 2 and 3, a gas supply unit 63 configured to supply etching gas to the internal space of the chamber 10 is disposed in the chamber 10. The gas supply unit 63 is connected with an etching gas supply tank 64 through a pipe. When the target substance is tin, the etching gas is hydrogen. The etching gas may be, for example, balance gas containing nitrogen ($N_2$) gas or argon (Ar) gas. In the following description, it is assumed that the target substance is tin and the etching gas contains hydrogen.

The gas supply unit 63 is adjusted so that the etching gas supplied into the chamber 10 flows near the reflective surface of the EUV light condensing mirror 50. Tin fine particles and tin ions are generated as plasma is generated from the target substance as the droplet DL in the plasma generation region AR, and the tin fine particles and the tin ions become stannane ($SnH_4$) gas at room temperature through reaction with hydrogen. A flow rate adjuster (not illustrated) may be provided to the pipe between the gas supply unit 63 and the etching gas supply tank 64.

The chamber 10 also includes a discharge unit 61. The discharge unit 61 discharges residual gas in the chamber 10. As illustrated in FIG. 2, discharge ports 61P of the discharge unit 61 are formed through, for example, facing walls of the chamber 10. The residual gas contains fine particles and charged particles generated through plasma generation from the target substance, a product material generated through reaction of the fine particles and charged particles with the etching gas, and unreacted etching gas. Some of the charged particles are neutralized in the chamber 10, and the residual gas contains the neutralized charged particles as well. The discharge unit 61 is connected with an exhaust device 62, and the residual gas discharged from the discharge unit 61 is provided with predetermined discharge treatment at the exhaust device 62.

The EUV light generation apparatus 100 also includes a magnetic field generation unit 65. The magnetic field generation unit 65 generates a magnetic field ML with which charged particles generated in the plasma generation region AR converge to the discharge ports 61P. When the discharge ports 61P of the discharge unit 61 are formed through the facing walls of the chamber 10 as described above, the magnetic field generation unit 65 may be configured by, for example, a pair of electromagnets 65M disposed to sandwich the facing walls of the chamber 10 as illustrated in FIG. 3. The electromagnets 65M are disposed so that the plasma generation region AR is positioned at the middle of the electromagnets 65M. The direction of current flowing through a superconductive coil of one of the electromagnets 65M is same as the direction of current flowing through a superconductive coil of the other electromagnet 65M. When such current is applied to the pair of superconductive coils, the magnetic field ML having a magnetic flux density that is highest near each electromagnet 65M and lower at a position closer to the plasma generation region AR is generated. The magnetic field ML preferably has a magnetic field axis MA intersecting a reflected light path of the EUV light condensing mirror 50 and passing through the plasma generation region AR. The magnetic field ML is also referred to as a mirror magnetic field.

The magnetic field generation unit 65 may generate a magnetic field for converging charged particles from the one electromagnet 65M side to the other electromagnet 65M side through the plasma generation region AR. The magnetic field generation unit 65 is configured by the electromagnets 65M but may be configured by a pair of permanent magnets.

The electromagnets 65M or permanent magnets as magnets for generating a magnetic field may be disposed inside the chamber 10.

Since charged particles generated in the plasma generation region AR are converged to the discharge ports 61P by the magnetic field ML generated by the magnetic field generation unit 65 as described above, the discharge ports 61P are positioned on the magnetic field axis MA of the magnetic field ML in the example illustrated in FIG. 3. The discharge ports 61P may be positioned downstream of the EUV light condensing mirror 50 in flow of the etching gas supplied from the gas supply unit 63. However, the discharge ports 61P are preferably positioned on the magnetic field axis MA of the magnetic field ML to efficiently discharge charged particles generated in the plasma generation region AR.

In addition, a trapping mechanism such as a heater configured to trap fine particles may be provided to at least one of a pair of the discharge units 61.

3.2 Operation

In the EUV light generation apparatus 100, an atmosphere in the chamber 10 is discharged, for example, at new installation or maintenance. In this process, purge and discharge may be repeated in the chamber 10 to discharge components in the atmosphere. Purge gas is preferably inert gas such as nitrogen ($N_2$) or argon (Ar). When the pressure in the chamber 10 becomes equal to or lower than a predetermined pressure after the atmosphere in the chamber 10 is discharged, the control unit 20 starts introduction of the etching gas from the gas supply unit 63 to the chamber 10. In this case, the control unit 20 may control a flow rate adjuster (not illustrated) while discharging gas in the internal space of the chamber 10 from the discharge unit 61 to the exhaust device 62 so that the pressure of the internal space of the chamber 10 is maintained at the predetermined pressure. The control unit 20 maintains the pressure of the internal space of the chamber 10 substantially constant based on a signal related to the pressure of the internal space of the chamber 10, which is measured by the pressure sensor 26. In this case, the pressure of the internal space of the chamber 10 is, for example, 10 Pa to 80 Pa.

The control unit 20 generates the magnetic field ML by driving the electromagnets 65M of the magnetic field generation unit 65.

The control unit 20 increases the temperature of the heater 44 through current supply from the heater power source 45, thereby heating the target substance in the tank 41 to a predetermined temperature equal to or higher than the melting point of the target substance. Thereafter, the control unit 20 controls the temperature of the target substance to the predetermined temperature by adjusting the amount of current supplied from the heater power source 45 to the heater 44 based on an output from a temperature sensor (not illustrated). The predetermined temperature is, for example, in the temperature range of 250° C. to 290° C. when the target substance is tin.

The control unit 20 controls the pressure in the tank 41 through the pressure adjuster 43 so that the target substance being melted is output from a nozzle hole of the nozzle 42 at a predetermined speed. The target substance discharged from the hole of the nozzle 42 may be in a jet form. In this case, the control unit 20 applies voltage having a predetermined waveform to the piezoelectric element 46 through the piezoelectric power source 47 to generate the droplet DL. Vibration of the piezoelectric element 46 can propagate through the nozzle 42 to a jet of the target substance output from the nozzle hole. The jet of the target substance is divided in a predetermined period by the vibration, and accordingly, the droplet DL is generated from the target substance.

The control unit 20 outputs a light emission trigger to the laser apparatus 30. Having received the light emission trigger, the laser apparatus 30 emits the laser beam 301 in pulses. The emitted laser beam 301 is incident on the laser condensing optical system 13 through the laser beam delivery optical system 35 and the window 12. In this case, the control unit 20 controls the laser beam manipulator 13C of the laser condensing optical system 13 so that the laser beam 301 condenses in the plasma generation region AR. In addition, the control unit 20 causes the laser apparatus 30 to emit the laser beam 301 based on a signal from the target sensor 27 so that the droplet DL is irradiated with the laser beam 301. Accordingly, the droplet DL is irradiated in the plasma generation region AR with the laser beam 301 converged by the laser beam condensing mirror 13A. Plasma generated through the irradiation radiates light including EUV light.

Among the light including EUV light generated in the plasma generation region AR, the EUV light 101 is condensed to the intermediate focus point IF by the EUV light condensing mirror 50 and then incident on the exposure apparatus 200.

When plasma is generated from the target substance, charged particles are generated as described above. Each charged particle receives Lorentz force from the magnetic field ML and moves on a trajectory through which the charged particle rotates in a plane orthogonal to a magnetic field line. When the charged particle moving in this manner has a speed component in a direction toward one of the discharge ports 61P, the charged particle moves toward the wall of the chamber 10 while converging on a helical trajectory along the magnetic field line. Then, the charged particle is induced to the discharge port 61P provided through the wall of the chamber 10 near a convergence part of the magnetic field ML, and accordingly, a large number of such charged particles flow into the discharge ports 61P. Thus, in a region in which charged particles move while converging, charged particles can exist at higher density than in the other space. As described above, some of charged particles generated through plasma generation from the target substance are neutralized. Charged particles having reached in an ejection pipe from the discharge ports 61P flow into the exhaust device 62 on discharge flow.

When plasma is generated from the target substance, electrically neutral fine particles are generated in addition to the above-described charged particles. The fine particles are not affected by the magnetic field ML generated by the magnetic field generation unit 65 and thus diffuse in the chamber 10. Some of the fine particles diffusing in the chamber 10 adhere to the reflective surface of the EUV light condensing mirror 50. The fine particles adhering to the reflective surface become a predetermined product material through reaction with the etching gas supplied from the gas supply unit 63. When the target substance is tin and the etching gas contains hydrogen as described above, the product material is stannane gas at room temperature. The product material obtained through reaction with the etching gas moves toward the discharge ports 61P on flow of unreacted etching gas. At least some of charged particles not converged to the discharge ports 61P by the magnetic field ML and fine particles not adhering to the reflective surface of the EUV light condensing mirror 50 can react with part of unreacted etching gas flowing inside the chamber 10. A product material obtained through this reaction moves toward the discharge ports 61P on flow of unreacted etching gas. At least part of unreacted etching gas flows into the discharge ports 61P.

Unreacted etching gas, fine particles, charged particles, neutralized charged particles, the above-described product material, and the like having flowed into the discharge ports 61P of the discharge unit 61 flow into the discharge unit 61 as residual gas and are provided with predetermined discharge treatment such as detoxification at the exhaust device 62.

4. Description of EUV Light Condensing Mirror of Comparative Example

The following describes an EUV light condensing mirror of a comparative example in the above-described extreme ultraviolet light generation apparatus. A component same as a component in the above description is denoted by the same reference sign, and duplicate description thereof will be omitted except for a case in which specific description is needed.

4.1 Configuration

Figure 4:
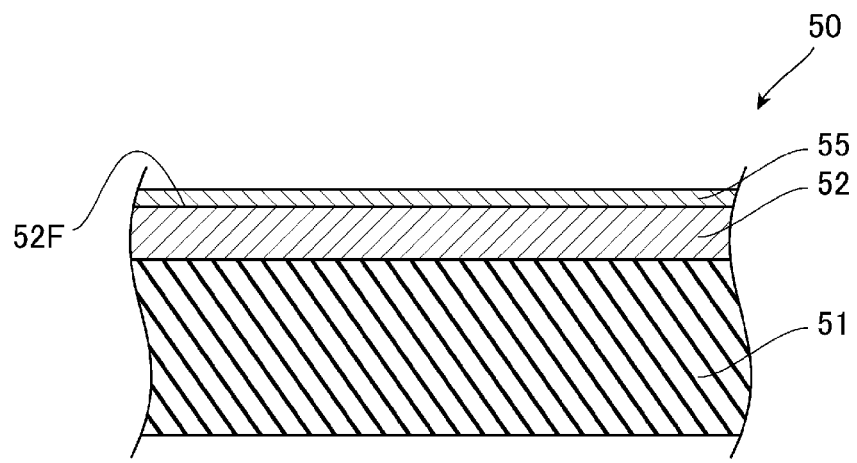
FIG. 4 is a pattern diagram illustrating a section of an extreme ultraviolet light condensing mirror of a comparative example.

FIG. 4 is a pattern diagram illustrating a section of the EUV light condensing mirror of the comparative example. As illustrated in FIG. 4, the EUV light condensing mirror 50 of the comparative example includes a substrate 51, a reflective layer 52, and a protective layer 55.

The reflective layer 52 reflects EUV light and is provided on the substrate 51. The reflective layer 52 includes a multi-layered film in which, for example, a first layer made of a first material and a second layer made of a second material are alternately stacked. The reflective surface of the EUV light condensing mirror 50 includes the interface between the first layer and the second layer in the reflective layer 52, and a surface 52F of the reflective layer 52. The protective layer 55 is disposed on the surface 52F of the reflective layer 52. Thus, the surface 52F of the reflective layer 52 as the reflective surface is the interface between the reflective layer 52 and the protective layer 55. The first material and the second material are not limited as long as the reflective layer 52 reflects EUV light, and the structure of the reflective layer 52 is not limited as well. For example, the first material may be Mo and the second material may be Si, or the first material may be Ru and the second material may be Si. Alternatively, for example, the first material may be Be and the second material may be Si, or the first material may be Nb and the second material may be Si. Alternatively, for example, the first material may be Mo and the second material may be $RbSiH_3$, or the first material may be Mo and the second material may be $Rb_xSi_y$.

The protective layer 55 protects the reflective layer 52 and is entirely made of an identical material. The protective layer 55 transmits EUV light. Examples of the material of the protective layer 55 include Ru, $SiO_2$, $Si_3N_4$, $Al_2O_3$, $Nb_2O_5$, $MoO_3$, $Y_2O_3$, $ZrO_2$, ZrN, $Sc_2O_3$, $CeO_2$, $Er_2O_3$, $Ta_2O_5$, $HfO_2$, $TiO_2$, and TiN. However, a material other than these exemplary materials may be used as the material of the protective layer 55.

4.2 Problem

Charged particles generated through plasma generation from the droplet DL converge to the discharge ports 61P on a helical trajectory along the magnetic field line of the magnetic field ML generated by the magnetic field generation unit 65 as described above. In this case, some of the charged particles collide with the protective layer 55 of the EUV light condensing mirror 50 in some cases. In addition, electrically neutral fine particles diffuse in the chamber 10 as described above. In this case, electrically neutral fine particles diffusing at fast speed collide with the protective layer 55 of the EUV light condensing mirror 50 in some cases. In the following description, fine particles include the charged particles and the electrically neutral fine particles in some cases.

When fine particles collide with the protective layer 55, the protective layer 55 is scraped and part of the surface 52F of the reflective layer 52 is potentially exposed from the protective layer 55. When the surface 52F of the reflective layer 52 is exposed in this manner, fine particles are likely to adhere to the exposed part. When fine particles adhere, other fine particles are likely to adhere to the adhering fine particles. Thus, it is concerned that, when the surface 52F of the reflective layer 52 is exposed, the surface of the EUV light condensing mirror 50 is contaminated by fine particles and EUV light reflectance of the EUV light condensing mirror 50 decreases.

When the protective layer 55 is made of a material that is unlikely to be scraped by collision with fine particles, the surface 52F of the reflective layer 52 can be prevented from being exposed from the protective layer 55 upon collision with fine particles. Such a material may be, for example, a material having a low density.

Each embodiment below exemplarily describes an extreme ultraviolet light generation apparatus that can reduce decrease of EUV light reflectance.

5. Description of EUV Light Condensing Mirror of Embodiment 1

The following describes the configuration of an EUV light condensing mirror of Embodiment 1. A component same as a component in the above description is denoted by the same reference sign, and duplicate description thereof will be omitted except for a case in which specific description is needed.

5.1 Configuration

Figure 5:
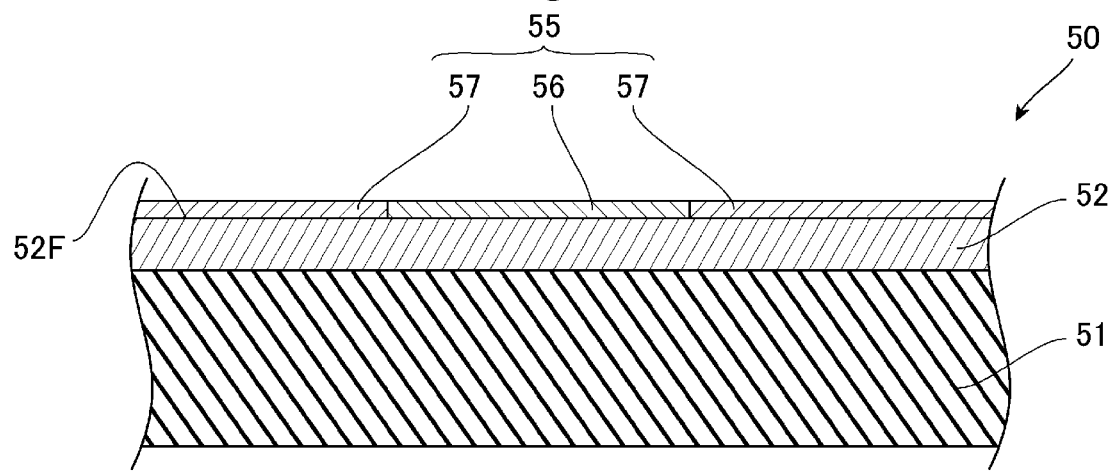
FIG. 5 is a pattern diagram illustrating a section of the extreme ultraviolet light condensing mirror of Embodiment 1.

FIG. 5 is a pattern diagram illustrating a section of the EUV light condensing mirror of the present embodiment. The EUV light condensing mirror 50 of the present embodiment is different from the EUV light condensing mirror 50 of the comparative example in that the protective layer 55 includes a first protective layer 56 and a second protective layer 57 disposed in two regions on the surface 52F of the reflective layer 52. In the following embodiments, similarly to the present embodiment, the protective layer 55 includes the first protective layer 56 and the second protective layer 57. Detailed description is given below.

Figure 6:
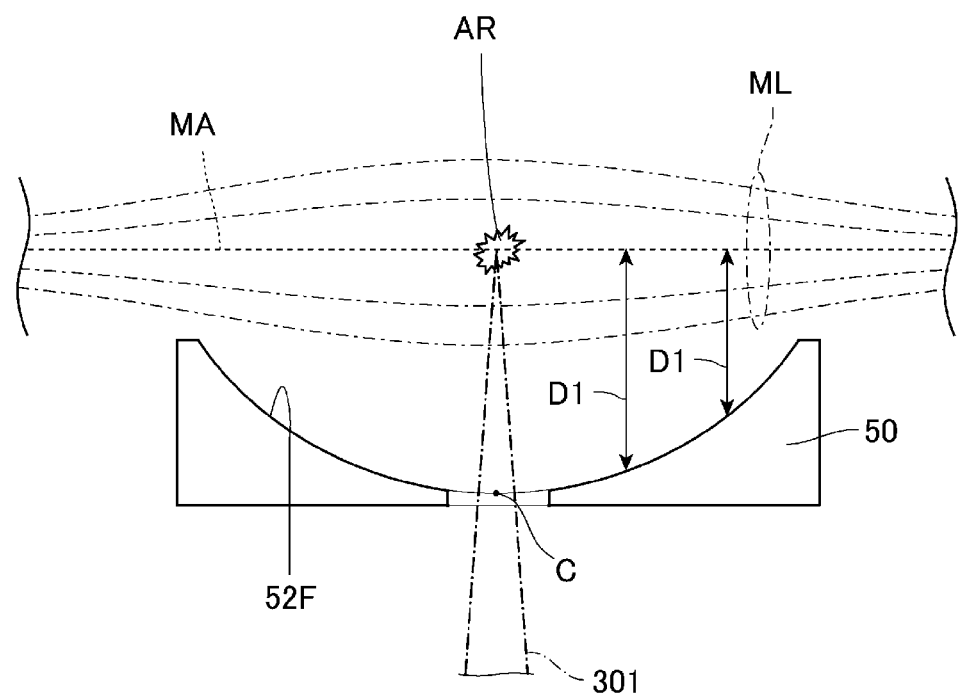
FIG. 6 is a pattern diagram illustrating the distance between a magnetic field axis and the surface of a reflective layer of the extreme ultraviolet light condensing mirror.

FIG. 6 is a pattern diagram illustrating the distance between the magnetic field axis MA and the surface 52F of the reflective layer 52 of the EUV light condensing mirror 50. The thickness of the protective layer 55 is negligibly small as compared to the distance, and thus the distance is referred to as the distance between the magnetic field axis MA and the EUV light condensing mirror 50 in some cases. As illustrated in FIG. 6, distance D1 between the magnetic field axis MA and the surface 52F of the reflective layer 52 of the EUV light condensing mirror 50 is the shortest distance between the magnetic field axis MA and the surface 52F of the reflective layer 52 of the EUV light condensing mirror 50. FIG. 6 illustrates distance D1. As understood from FIG. 6, distance D1 differs with the position on the surface 52F of the reflective layer 52.

Figure 7:
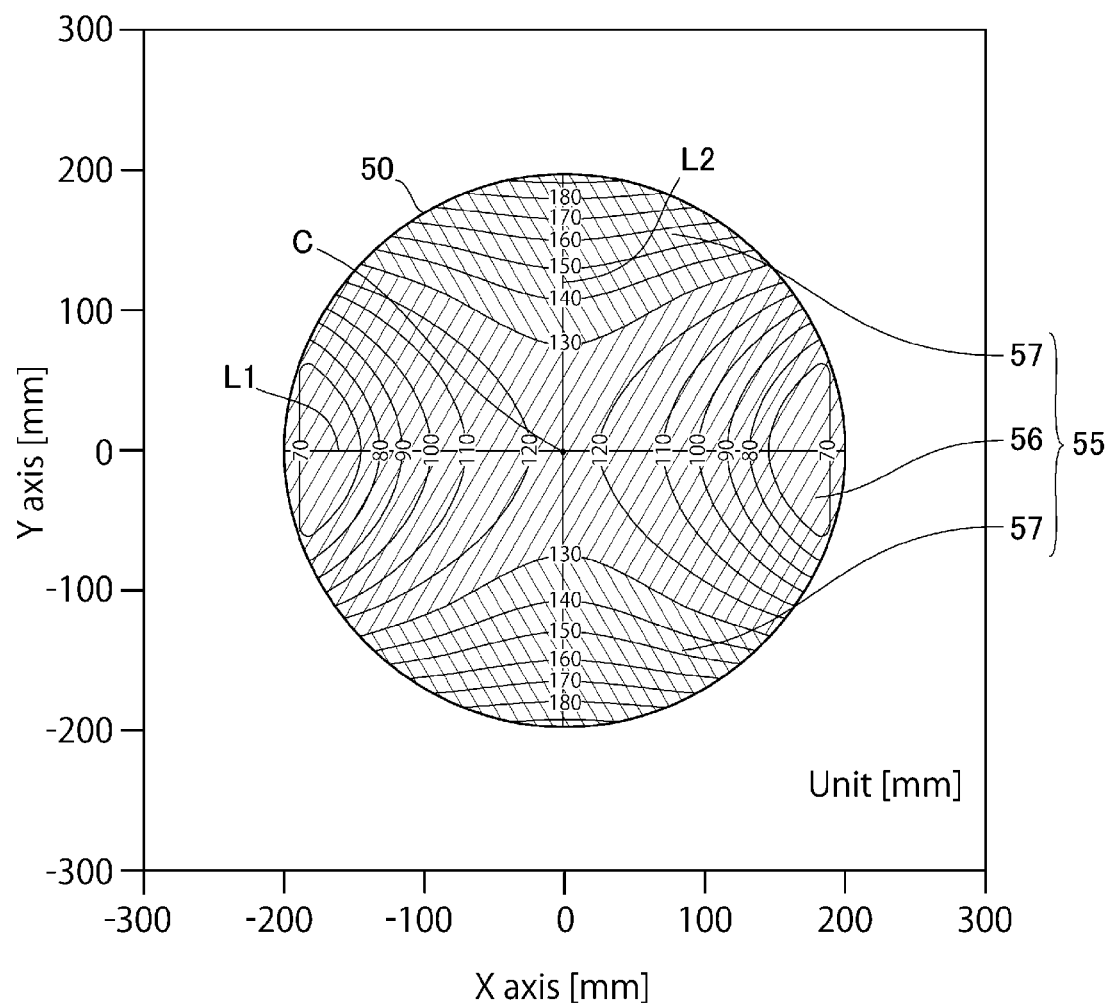
FIG. 7 is a diagram illustrating distribution of the distance between the magnetic field axis and the surface of the reflective layer of the extreme ultraviolet light condensing mirror and an exemplary status of a protective layer of the extreme ultraviolet light condensing mirror of Embodiment 1.

FIG. 7 is a diagram illustrating distribution of distance D1 between the magnetic field axis MA and the surface 52F of the reflective layer 52 of the EUV light condensing mirror 50 and an exemplary status of the protective layer 55 of the EUV light condensing mirror 50 of the present embodiment. FIG. 7 illustrates the distance distribution in front view of the surface 52F of the spheroid reflective layer 52. In FIG. 7, an opening that is formed at the EUV light condensing mirror 50 and through which the laser beam 301 propagates is omitted. The protective layer 55 disposed on the surface 52F of the reflective layer 52 includes the first protective layer 56 and the second protective layer 57 as described above. In FIG. 7, the first protective layer 56 and the second protective layer 57 are hatched in directions different from each other.

The first protective layer 56 is disposed in a first region on the surface 52F of the reflective layer 52. In the present embodiment, the first region is a region in which distance D1 between the magnetic field axis MA and the surface 52F of the reflective layer 52 is equal to or shorter than a predetermined distance. In the example illustrated in FIG. 7, the first region is a region in which distance D1 is equal to or shorter than 130 mm and in which the first protective layer 56 is disposed. A second region is a region other than the first region on the surface 52F of the reflective layer 52. In the example illustrated in FIG. 7, the second region is a region in which distance D1 is longer than 130 mm and in which the second protective layer 57 is disposed.

In FIG. 7, line L1 represents the magnetic field axis MA projected onto the surface 52F of the reflective layer 52 of the EUV light condensing mirror 50. Line L1 extends through a center C of the EUV light condensing mirror 50 along the magnetic field axis MA on the surface 52F of the reflective layer 52. As understood from FIG. 7, in the present embodiment, when the first region is defined as described above, the first region extends from one end part of line L1 along the magnetic field axis MA on the surface 52F of the reflective layer 52 to the other end part. The shape of the first region is symmetric with respect to line L1 and line L2 orthogonal to line L1 on the surface 52F of the reflective layer 52. Thus, the first protective layer 56, as well, extends from one end part of line L1 along the magnetic field axis MA on the surface 52F of the reflective layer 52 to the other end part and has a symmetric shape with respect to line L1. The second region is positioned on one side and the other side of line L1 along the magnetic field axis MA and has a symmetric shape with respect to line L1 along the magnetic field axis MA. Accordingly, the second protective layer 57, as well, is disposed on one side and the other side of line L1 along the magnetic field axis MA and has a symmetric shape with respect to line L1 along the magnetic field axis MA.

The following describes the materials of the first protective layer 56 and the second protective layer 57. The material of the first protective layer 56 is less dense than the material of the second protective layer 57, and the material of the second protective layer 57 has an EUV light transmittance higher than that of the material of the first protective layer 56. Examples of the material of the protective layer 55 include $TiO_2$, TiN, $ZrO_2$, ZrN, $Nb_2O_5$, and $CeO_2$. The density of $TiO_2$ is 4.23 g/cm$^3$. The density of TiN is 5.22 g/cm$^3$. The density of $ZrO_2$ is 5.68 g/cm$^3$. The density of ZrN is 7.09 g/cm$^3$. The density of $Nb_2O_5$ is 4.6 g/cm$^3$. The density of $CeO_2$ is 7.22 g/cm$^3$. The EUV light transmittance of $TiO_2$ is 97.9%/nm. The EUV light transmittance of TiN is 98.2%/nm. The EUV light transmittance of $ZrO_2$ is 98.6%/nm. The EUV light transmittance of ZrN is 99.1%/nm. The EUV light transmittance of $Nb_2O_5$ is 98.7%/nm. The EUV light transmittance of $CeO_2$ is 98.4%/nm.

When the first protective layer 56 contains, for example, $TiO_2$, the second protective layer 57 preferably contains at least one of TiN, $ZrO_2$, ZrN, $Nb_2O_5$, and $CeO_2$. When the first protective layer 56 contains, for example, TiN, the second protective layer 57 preferably contains at least one of $ZrO_2$, ZrN, and $CeO_2$. When the first protective layer 56 contains, for example, $ZrO_2$, the second protective layer 57 preferably contains at least one of $Nb_2O_5$ and ZrN. When the first protective layer 56 contains, for example, $Nb_2O_5$, the second protective layer 57 preferably contains ZrN. In the present specification, a material described to be contained in a layer is a main material of the layer.

Figure 8:
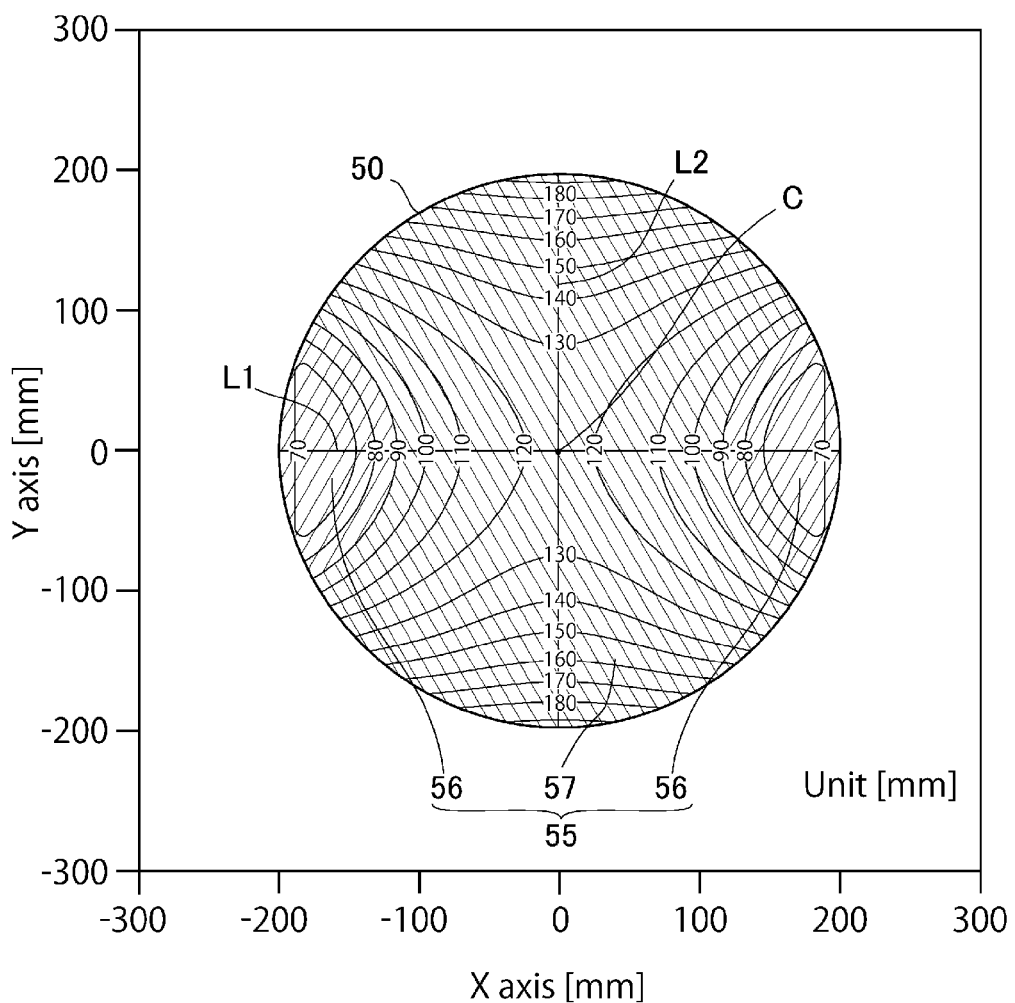
FIG. 8 is a diagram illustrating distribution of the distance between the magnetic field axis and the surface of the reflective layer of the extreme ultraviolet light condensing mirror and another exemplary status of the protective layer of the extreme ultraviolet light condensing mirror of Embodiment 1.

FIG. 8 is a diagram illustrating distribution of the distance between the magnetic field axis MA and the surface 52F of the reflective layer 52 of the EUV light condensing mirror 50, and another exemplary status of the protective layer 55 of the EUV light condensing mirror 50 of the present embodiment. FIG. 8 illustrates the distance distribution in front view of the surface 52F of the spheroid reflective layer 52. In FIG. 8, an opening that is formed at the EUV light condensing mirror 50 and through which the laser beam 301 propagates is omitted. In the example of the EUV light condensing mirror 50 illustrated in FIG. 7, as described above, the first region is a region in which the distance between the magnetic field axis MA and the surface 52F of the reflective layer 52 is equal to or shorter than 130 mm. In the example of the EUV light condensing mirror 50 illustrated in FIG. 8, however, the first region is a region in which the distance between the magnetic field axis MA and the surface 52F of the reflective layer 52 is equal to or shorter than 90 mm. In the example illustrated in FIG. 7, as described above, the first region extends from one end part of line L1 along the magnetic field axis MA on the surface 52F of the reflective layer 52 to the other end part. In the example illustrated in FIG. 8, however, the first region includes an end part of line L1 but does not include a region at a certain distance from the center C of the surface 52F of the reflective layer 52. Specifically, as understood from FIG. 8, in the present embodiment, when the first region is defined in the example illustrated in FIG. 8, the second region extends from one end part of line L2 orthogonal to line L1 on the surface 52F of the reflective layer 52 to the other end part. Thus, the second protective layer 57, as well, extends from one end part of line L2 on the reflective layer 52 to the other end part and has a symmetric shape with respect to lines L1 and L2. As described above, the first region is positioned on one side and the other side of line L2, includes end parts of line L1, and has a symmetric shape with respect to lines L1 and L2. Thus, the first protective layer 56, as well, is disposed on one side and the other side of line L2, includes end parts of line L1, and has a symmetric shape with respect to lines L1 and L2.

In this case, since the area of the second protective layer 57 having an EUV light transmittance higher than that of the first protective layer 56 is larger than in the example illustrated in FIG. 7, the EUV light reflectance of the EUV light condensing mirror 50 is higher than in the example of the EUV light condensing mirror 50 in FIG. 7.

The method of manufacturing the protective layer 55 of the present embodiment may be selected from among two manufacturing methods below. However, a manufacturing method other than the two manufacturing methods below may be employed. In the first manufacturing method, after the reflective layer 52 is deposited, a mask is formed in the second region on the surface 52F of the reflective layer 52. Accordingly, the first region on the surface 52F is exposed, and the first protective layer 56 is deposited in the first region. Subsequently, the mask is removed, and another mask is formed on the first protective layer 56. Accordingly, the second region on the surface 52F is exposed, and the second protective layer 57 is deposited in the second region. Then, the mask on the first protective layer 56 is removed. In this manner, the protective layer 55 is manufactured. In the second manufacturing method, a deposition device capable of performing deposition at a local site on the surface 52F of the reflective layer 52 is used, and the deposition device and the EUV light condensing mirror 50 on which the protective layer 55 is being deposited are relatively moved to deposit the first protective layer 56 in the first region and subsequently deposit the second protective layer 57 in the second region. In this manner, the protective layer 55 is manufactured. In the first and second manufacturing methods, any of the first protective layer 56 and the second protective layer 57 may be deposited first.

Figure 9:
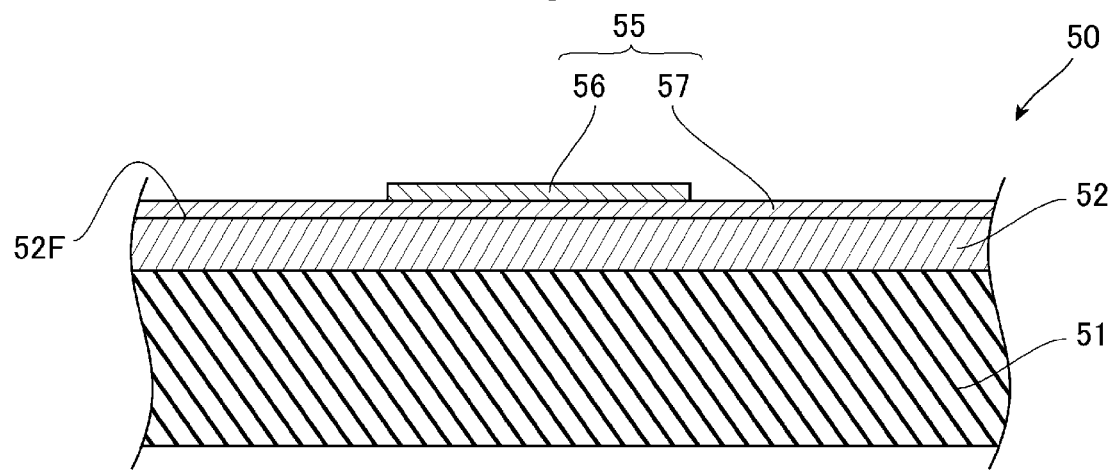
FIG. 9 is a pattern diagram illustrating a section of an example of the extreme ultraviolet light condensing mirror, which is different from the example illustrated in FIG. 5.

FIG. 9 is a pattern diagram illustrating a section of an example of the EUV light condensing mirror of the present embodiment, which is different from the example illustrated in FIG. 5. The present example is different from the example illustrated in FIG. 5 in that the second protective layer 57 is disposed between the reflective layer 52 and the first protective layer 56 in the first region. Thus, with respect to the example illustrated in FIG. 7 and the example illustrated in FIG. 8, the second protective layer 57 is disposed on the surface 52F of the reflective layer 52 in the first region, and the first protective layer 56 is disposed in the first region on the disposed second protective layer 57. Such a method of manufacturing the protective layer 55 may be performed as follows. After the reflective layer 52 is deposited, the second protective layer 57 is deposited on the entire surface 52F of the reflective layer 52. Subsequently, a mask is formed in the second region on the second protective layer 57. Thus, the first region on the second protective layer 57 is exposed, and the first protective layer 56 is deposited in the first region. Then, the mask formed in the second region is removed. In this manner, the protective layer 55 illustrated in FIG. 9 is manufactured. When the second protective layer 57 is disposed between the reflective layer 52 and the first protective layer 56 as described above, gap generation between the first protective layer 56 and the second protective layer 57 around the first region due to manufacturing error and the like is reduced. Thus, accumulation of fine particles can be reduced even when error occurs to the disposition position of the first protective layer 56. Moreover, in the first region, the second protective layer 57 is exposed when the first protective layer 56 is scraped by collision with fine particles, and thus the reflective layer 52 is unlikely to be exposed from the protective layer 55. Thus, such an EUV light condensing mirror 50 can have improved durability.

It is expected that, as the intensity and pulse repetition frequency of the laser beam 301 in pulses with which the droplet DL is irradiated increase, the number of fine particles colliding with the EUV light condensing mirror 50 increases and the energy of fine particles increases. In each of the example of the protective layer 55 in FIG. 5 and the example of the protective layer 55 in FIG. 9, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

5.2 Effect

As described above, the EUV light condensing mirror 50 of the EUV light generation apparatus 100 of the present embodiment includes the substrate 51, the reflective layer 52 provided on the substrate 51 to reflect the EUV light 101, and the protective layer 55 provided on the reflective layer 52. The protective layer 55 includes the first protective layer 56 disposed in the first region including at least part of line L1 extending through the center C of the EUV light condensing mirror 50 along the magnetic field axis MA on the surface 52F of the reflective layer 52, and the second protective layer 57 disposed in the second region other than the first region on the surface of the reflective layer. The material of the first protective layer 56 is less dense than the material of the second protective layer 57. The material of the second protective layer 57 has an EUV light transmittance higher than that of the material of the first protective layer 56.

It is thought that fine particles are likely to collide, due to influence of the magnetic field ML, with the region including at least part of line L1 along the magnetic field axis MA on the surface 52F of the reflective layer 52 of the EUV light condensing mirror 50 in the EUV light generation apparatus 100. Thus, like the EUV light generation apparatus 100, the reflective layer 52 can be prevented from being exposed from the protective layer 55 when the first protective layer 56 having a low density and relatively unlikely to be scraped by collision with fine particles is disposed in the first region in which fine particles are thought to be likely to collide. Thus, it is possible to reduce decrease of the reflectance of the EUV light condensing mirror 50 due to accumulation of fine particles on the reflective layer 52 through exposure of the reflective layer 52. Moreover, the material of the second protective layer 57 disposed in the second region in which fine particles are thought to be less likely to collide than the first region is set to have an EUV light transmittance higher than that of the material of the first protective layer 56. Thus, it is possible to reduce decrease of the reflectance of the EUV light condensing mirror 50 as compared to a case in which the second protective layer 57 is made of a material same as that of the first protective layer 56. In this manner, in the EUV light generation apparatus 100 of the present embodiment, decrease of the EUV light reflectance can be reduced.

Furthermore, in the present embodiment, regions in which fine particles are likely to collide with the EUV light condensing mirror 50 due to influence of the magnetic field ML of the EUV light generation apparatus 100 are defined with respect to the magnetic field axis MA, and the first region is a region in which the distance between the magnetic field axis MA and the surface 52F of the reflective layer 52 is equal to or shorter than a predetermined distance. Charged particles generated through plasma generation from the droplet DL in the plasma generation region AR converge toward the wall of the chamber 10 under influence of the magnetic field ML, but some charged particles collide with the EUV light condensing mirror 50. Thus, it is thought that, in the region, the number of fine particles colliding with the EUV light condensing mirror 50 is large and the energy of colliding fine particles is high in some cases. Thus, the first region is determined based on the distance between the magnetic field axis MA and the surface 52F of the reflective layer 52 like the EUV light generation apparatus 100 of the present embodiment so that the protective layer 55 can be prevented from being scraped.

6. Description of EUV Light Condensing Mirror of Embodiment 2

The Following describes the configuration of an EUV light condensing mirror of Embodiment 2. A component same as a component in the above description is denoted by the same reference sign, and duplicate description thereof will be omitted except for a case in which specific description is needed.

6.1 Configuration

The EUV light condensing mirror 50 of the present embodiment is different from the EUV light condensing mirror 50 of Embodiment 1 in that the first region is determined based on the magnetic flux density of the magnetic field ML on the surface 52F of the reflective layer 52.

Figure 10:
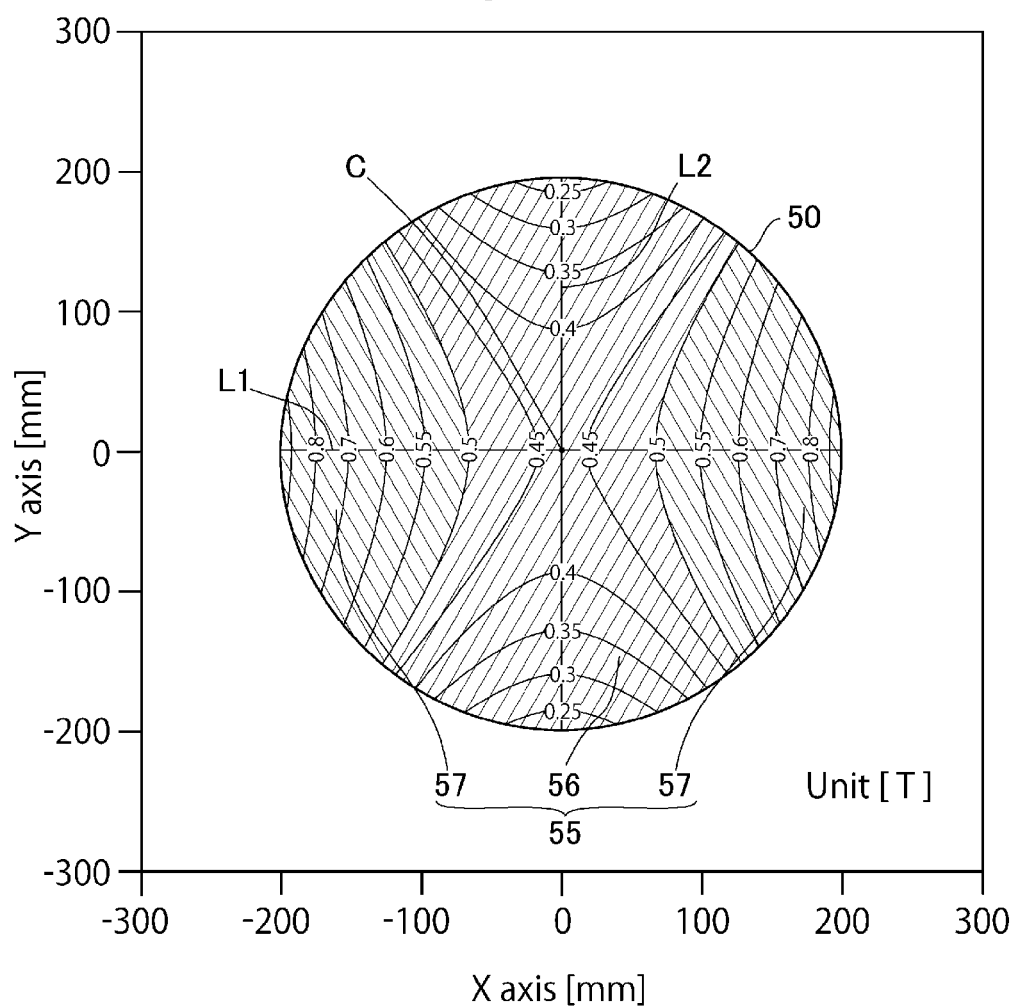
FIG. 10 is a diagram illustrating distribution of magnetic flux density on the surface of the reflective layer, and the status of the protective layer of the extreme ultraviolet light condensing mirror of Embodiment 2.

FIG. 10 is a diagram illustrating distribution of the magnetic flux density on the surface 52F of the reflective layer 52, and the status of the protective layer 55 of the EUV light condensing mirror 50 of the present embodiment. FIG. 10 illustrates distribution of the magnetic flux density in front view of the surface 52F of the spheroid reflective layer 52. In FIG. 10, an opening that is formed at the EUV light condensing mirror 50 and through which the laser beam 301 propagates is omitted. In the present embodiment as well, the protective layer 55 includes the first protective layer 56 and the second protective layer 57, and in FIG. 10, the first protective layer 56 and the second protective layer 57 are hatched in directions different from each other.

In FIG. 10, each numerical value written on the surface 52F of the reflective layer 52 indicates the magnetic flux density (T) of the surface 52F of the reflective layer 52. In the present embodiment, the first region is a region in which the magnetic flux density of the magnetic field ML on the surface 52F of the reflective layer 52 is equal to or lower than a predetermined magnetic flux density. In the example of FIG. 10, the first region is a region in which the magnetic flux density is equal to or lower than 0.5 T, and the first protective layer 56 is disposed in the first region on the surface 52F of the reflective layer 52. Similarly to Embodiment 1, the second region is a region other than the first region on the surface 52F of the reflective layer 52, and the second protective layer 57 is disposed in the second region on the surface 52F of the reflective layer 52.

As understood from FIG. 10, in the present embodiment, when the first region is defined as described above, the first region includes the center C of the surface 52F of the reflective layer 52 and extends from one end part of line L2 orthogonal to line L1 along the magnetic field axis MA to the other end part. The first region has a symmetric shape with respect to lines L1 and L2. In the present embodiment, the predetermined magnetic flux density is determined so that the first region includes at least part of line L1. Thus, the first protective layer 56, as well, includes at least part of line L1, extends from one end part of line L2 to the other end part, and has a symmetric shape with respect to lines L1 and L2. The second region is positioned on one side and the other side of line L2 and has a symmetric shape with respect to line L2. Thus, the second protective layer 57, as well, is disposed on one side and the other side of line L2 and has a symmetric shape with respect to lines L1 and L2.

Similarly to the protective layer 55 of Embodiment 1, the protective layer 55 of the present embodiment may have a section in a status same as that in the example illustrated in FIG. 5 or the example illustrated in FIG. 9. Thus, the method of manufacturing the protective layer 55 may be same as the method of manufacturing the protective layer 55 described in Embodiment 1.

Furthermore, in the present embodiment as well, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

6.2 Effect

As described above, charged particles generated through plasma generation from the droplet DL in the plasma generation region AR converge toward the wall of the chamber 10 on a helix trajectory by force received from the magnetic field ML. Thus, it is thought that, when the force received from the magnetic field ML is small, the charged particles are likely to collide with the EUV light condensing mirror 50. Accordingly, it is thought that the number of charged particles is larger and the energy of charged particles is higher at a position where the magnetic flux density is lower on the surface 52F of the reflective layer 52.

In the present embodiment, the first region is a region in which the magnetic flux density of the magnetic field ML on the surface 52F of the reflective layer 52 is equal to or lower than a predetermined magnetic flux density as described above. Thus, the first protective layer 56 unlikely to be scraped by collision of charged particles is disposed in a region in which charged particles are likely to collide on the surface 52F of the reflective layer 52. Accordingly, the reflective layer 52 can be prevented from being exposed from the protective layer 55. Thus, it is possible to reduce decrease of the reflectance of the EUV light condensing mirror 50 due to accumulation of fine particles on the reflective layer 52 through exposure of the reflective layer 52.

7. Description of EUV Light Condensing Mirror of Embodiment 3

The following describes the configuration of an EUV light condensing mirror of Embodiment 3. A component same as a component in the above description is denoted by the same reference sign, and duplicate description thereof will be omitted except for a case in which specific description is needed.

7.1 Configuration

The EUV light condensing mirror 50 of the present embodiment is different from the EUV light condensing mirror 50 of each embodiment described above in that the first region is defined based on the distance between the focusing position of the laser beam 301 and the surface 52F of the reflective layer 52.

Figure 11:
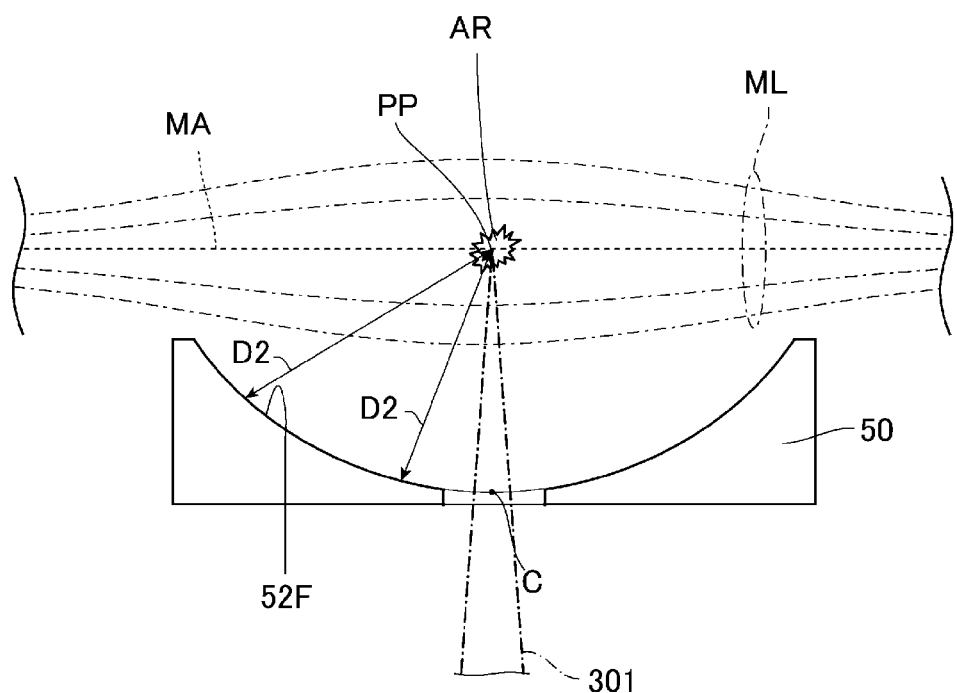
FIG. 11 is a pattern diagram illustrating the distance between the surface of the reflective layer and the focusing position of a laser beam.

FIG. 11 is a pattern diagram illustrating the distance between the surface 52F of the reflective layer 52 and the focusing position of the laser beam 301. As described above, the droplet DL is irradiated with the laser beam 301 at the focusing position of the laser beam 301, and plasma is generated from the target substance of the droplet DL. Thus, the focusing position of the laser beam 301 is positioned in the plasma generation region AR and referred to as a plasma point PP in some cases. In FIG. 11, the focusing position of the laser beam 301 is indicated as the plasma point PP. The thickness of the protective layer 55 is negligibly small as compared to the distance between the surface 52F of the reflective layer 52 and the focusing position of the laser beam 301, and thus the distance is referred to as the distance between the focusing position of the laser beam 301 and the EUV light condensing mirror 50 in some cases.

When the first focal point of the EUV light condensing mirror 50 is positioned in the plasma generation region AR as described above, distance D2 between the surface 52F of the reflective layer 52 and the focusing position of the laser beam 301 is the distance from the one of the focal points of the EUV light condensing mirror 50 to the surface 52F of the reflective layer 52. As understood from FIG. 11, distance D2 differs with the position on the surface 52F of the reflective layer 52 of the EUV light condensing mirror 50.

Figure 12:
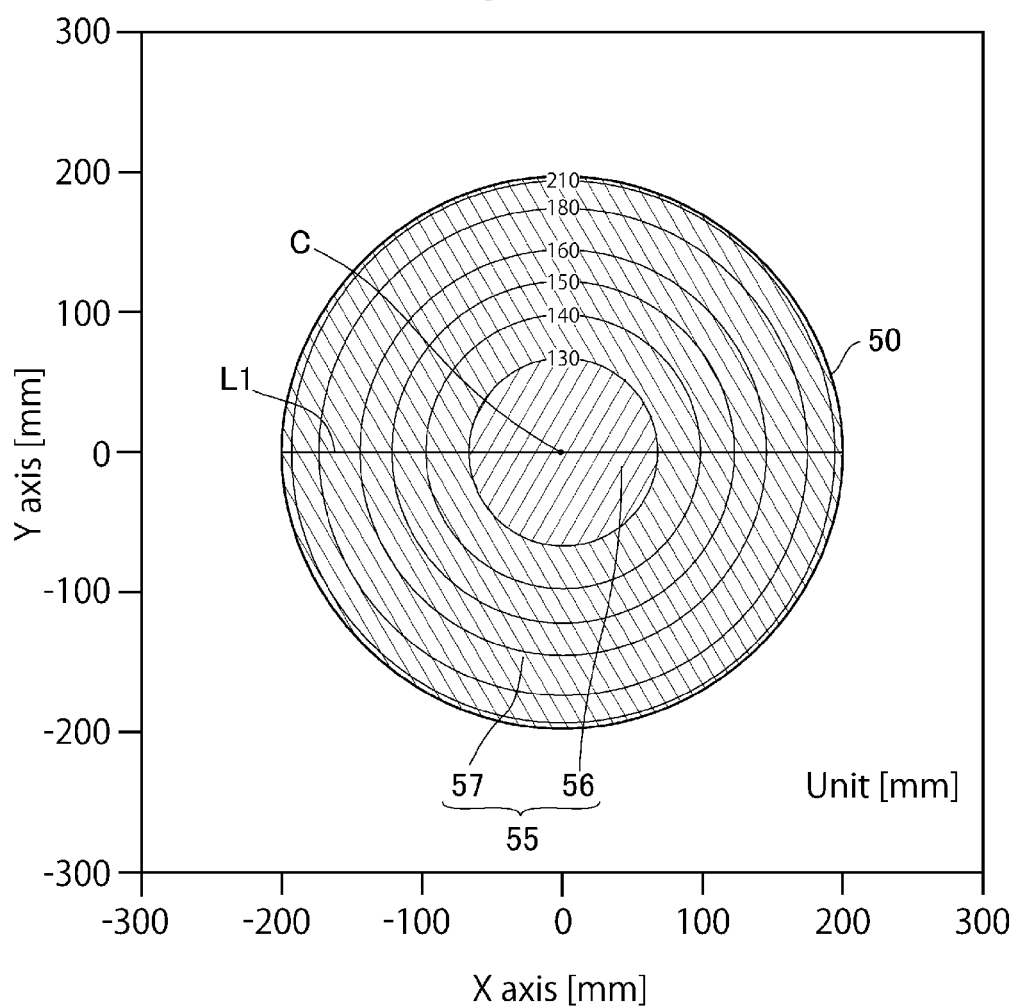
FIG. 12 is a diagram illustrating distribution of the distance between the surface of the reflective layer and the focusing position of a laser beam, and the status of the protective layer of the extreme ultraviolet light condensing mirror of Embodiment 3.

FIG. 12 is a diagram illustrating distribution of distance D2 between the surface 52F of the reflective layer 52 and the focusing position of the laser beam 301, and the status of the protective layer 55 of the EUV light condensing mirror 50 of the present embodiment. FIG. 12 illustrates the distance distribution in front view of the surface 52F of the spheroid reflective layer 52. In FIG. 12, an opening that is formed at the EUV light condensing mirror 50 and through which the laser beam 301 propagates is omitted. As described above, the protective layer 55 includes the first protective layer 56 and the second protective layer 57. In FIG. 12, the first protective layer 56 and the second protective layer 57 are hatched in directions different from each other.

In FIG. 12, each numerical value written on the surface 52F of the reflective layer 52 indicates distance D2. In the present embodiment, the first region is a region in which distance D2 between the surface 52F of the reflective layer 52 and the focusing position of the laser beam 301 is equal to or shorter than a predetermined distance on the surface 52F of the reflective layer 52. In the example of FIG. 12, the first region is a region in which distance D2 is equal to or shorter than 130 mm, and the first protective layer 56 is disposed in the first region on the surface 52F of the reflective layer 52. Similarly to Embodiment 1, the second region is a region other than the first region on the surface 52F of the reflective layer 52, and the second protective layer 57 is disposed in the second region on the surface 52F of the reflective layer 52.

As understood from FIG. 12, in the present embodiment, when the first region is defined as described above, the first region is a region within a predetermined range from the center C on the surface 52F of the reflective layer 52 and has a rotationally symmetric shape with respect to the center C and a symmetric shape with respect to line L1. Thus, the first protective layer 56, as well, is a region within the predetermined range from the center C and has a rotationally symmetric shape with respect to the center C and a symmetric shape with respect to line L1. Accordingly, the first protective layer 56 has a circular outer periphery in front view of the EUV light condensing mirror 50. The second region is a region surrounding the first region. The second protective layer 57 surrounds the first protective layer 56.

Similarly to the protective layer 55 of Embodiment 1, the protective layer 55 of the present embodiment may have a section in a status same as that in the example illustrated in FIG. 5 or the example illustrated in FIG. 9. Thus, the method of manufacturing the protective layer 55 may be same as the method of manufacturing the protective layer 55 described in Embodiment 1.

Furthermore, in the present embodiment as well, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

7.2 Effect

As described above, it is thought that, when fine particles generated through plasma generation from the droplet DL in the plasma generation region AR collide with the EUV light condensing mirror 50, the fine particles are likely to collide in a region closer to the plasma point PP on the EUV light condensing mirror 50. Thus, it is thought that the number of fine particles is larger and the energy of charged particles is higher in a region closer to the plasma point PP on the EUV light condensing mirror 50.

In the present embodiment, as described above, the first region in which the first protective layer 56 is disposed is a region in which distance D2 between the surface 52F of the reflective layer 52 and the focusing position of the laser beam 301 is equal to or shorter than a predetermined distance on the surface 52F of the reflective layer 52. In other words, the first protective layer 56 unlikely to be scraped by collision with charged particles is disposed in a region in which charged particles are thought to be likely to collide on the surface 52F of the reflective layer 52. Accordingly, the reflective layer 52 can be prevented from being exposed from the protective layer 55. Thus, it is possible to reduce decrease of the reflectance of the EUV light condensing mirror 50 due to accumulation of fine particles on the reflective layer 52 through exposure of the reflective layer 52.

In the present embodiment, the first region and the second region are defined irrespective of the magnetic field ML. Thus, the EUV light condensing mirror 50 of the present embodiment is also applicable to an EUV light generation apparatus not including the magnetic field generation unit 65. In the EUV light generation apparatus not including the magnetic field generation unit 65, fine particles in the chamber 10 can be discharged from the discharge unit 61 through, for example, gas flow caused by the etching gas introduction and the residual gas ejection.

8. Description of EUV Light Condensing Mirror of Embodiment 4

The following describes the configuration of an EUV light condensing mirror of Embodiment 4. A component same as a component in the above description is denoted by the same reference sign, and duplicate description thereof will be omitted except for a case in which specific description is needed.

8.1 Configuration

The EUV light condensing mirror 50 of the present embodiment is different from the EUV light condensing mirror 50 of each embodiment described above in that the first region is defined based on an angle θ between the optical axis of the laser beam and a line connecting the surface of the reflective layer and the focusing position of the laser beam.

Figure 13:
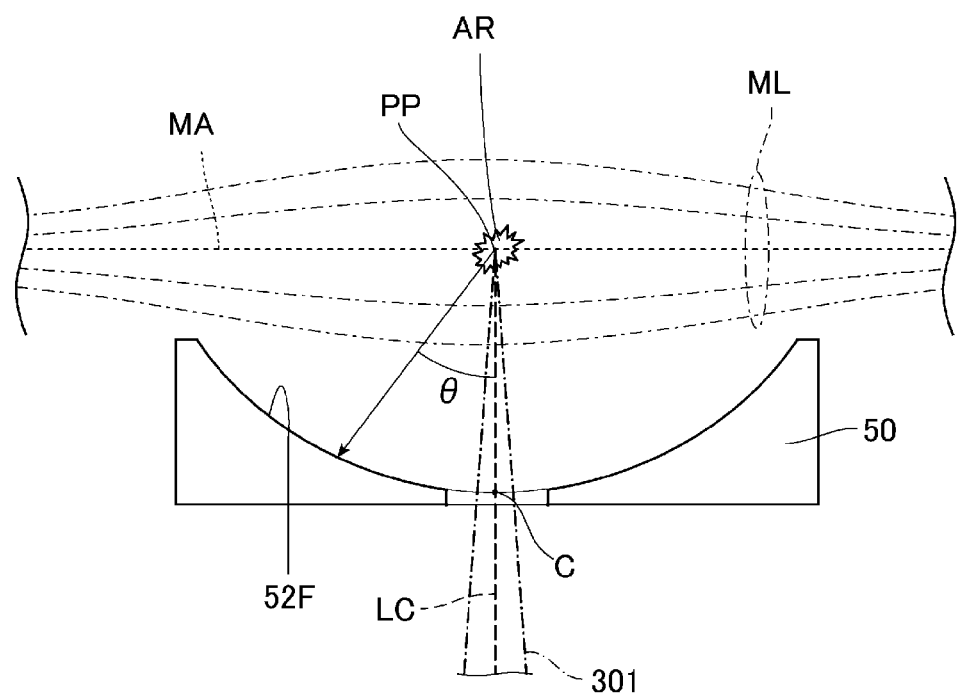
FIG. 13 is a diagram illustrating the angle between the optical axis of a laser beam and a line connecting the surface of the reflective layer and the focusing position of the laser beam.

FIG. 13 is a diagram illustrating the angle θ between an optical axis LC of the laser beam 301 and a line connecting the surface 52F of the reflective layer 52 and the focusing position of the laser beam 301. In FIG. 13 as well, the focusing position of the laser beam 301 is indicated as the plasma point PP.

Figure 14:
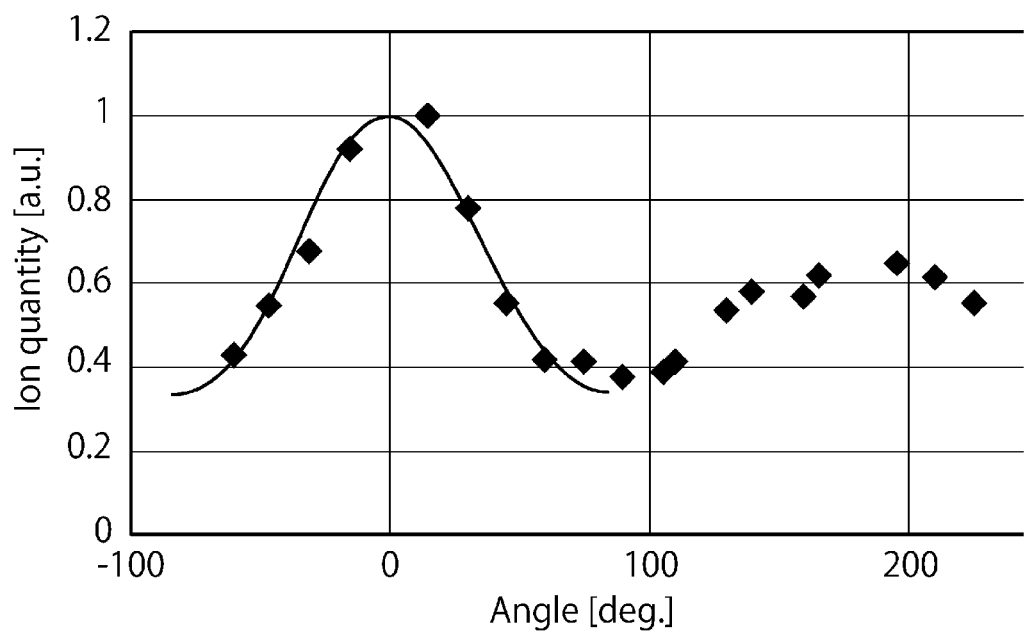
FIG. 14 is a graph illustrating the relation between the angle between the optical axis of a laser beam and the line connecting the surface of the reflective layer and the focusing position of the laser beam and the number of fine particles scattering to the extreme ultraviolet light condensing mirror.

FIG. 14 is a graph illustrating the relation between the angle θ between the optical axis LC of the laser beam 301 and the line connecting the surface 52F of the reflective layer 52 and the focusing position of the laser beam 301 and the number of fine particles scattering to the EUV light condensing mirror 50. In FIG. 14, ion quantity for charged particles as fine particles is plotted against the angle θ. The curve in FIG. 14 is calculated as follows. First, a plurality of mutually different values of the angle θ illustrated in FIG. 13 are selected, and the number of fine particles at each value of the angle θ is measured. Subsequently, a curve most approximate to the angle θ and the number of fine particles thus measured is calculated. In FIG. 14, the curve is calculated for the angle θ of −90° to 90°. Discussion can be based on the absolute value of the angle θ because of the symmetric property of the EUV light condensing mirror 50. Thus, in the following description, the angle θ is expressed in its absolute value. As understood from FIG. 14, the number of scattering fine particles is largest on a side closer to the optical axis LC of the laser beam 301 where the angle θ is small, and the number of scattering fine particles is smaller as the angle θ to the optical axis LC increases.

Figure 15:
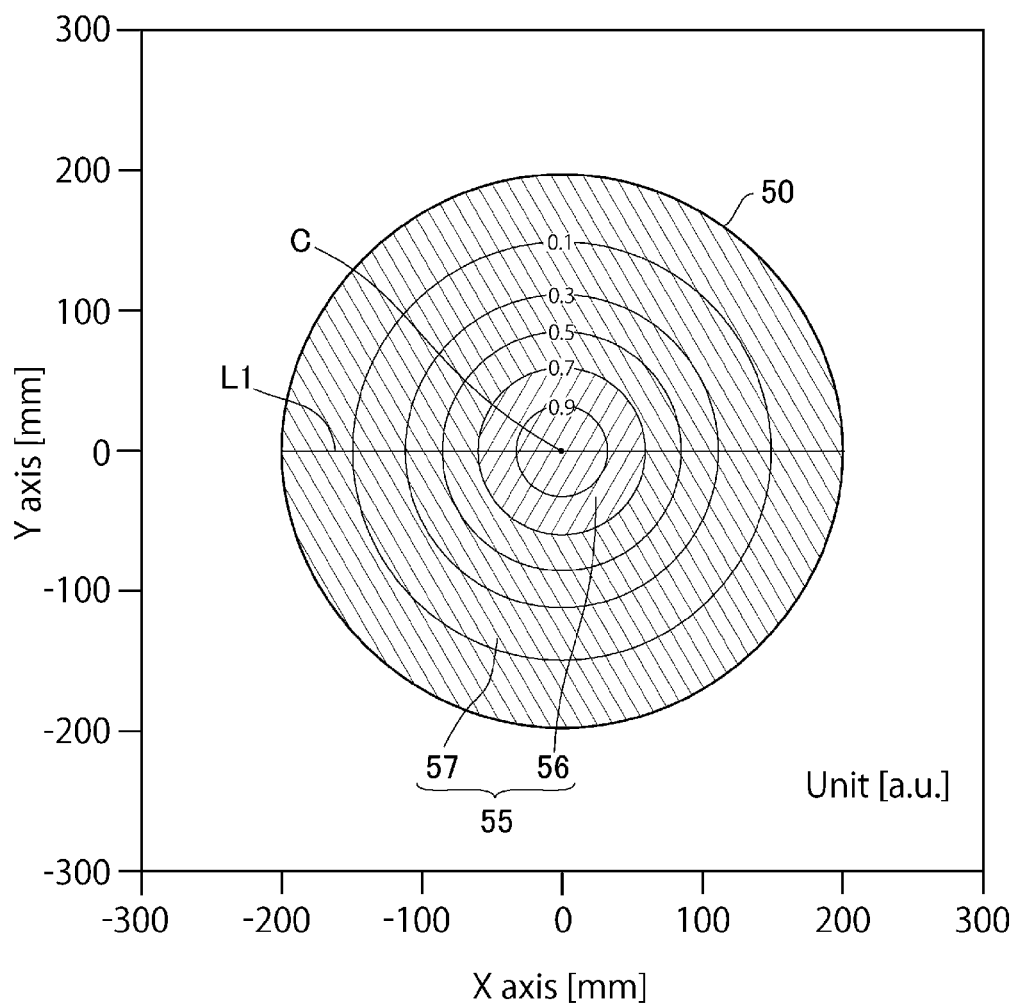
FIG. 15 is a diagram illustrating the number of fine particles scattering to the extreme ultraviolet light condensing mirror, and the status of the protective layer of the extreme ultraviolet light condensing mirror of Embodiment 4.

FIG. 15 is a diagram illustrating the number of fine particles scattering to the EUV light condensing mirror 50, and the status of the protective layer 55 of the EUV light condensing mirror 50 of the present embodiment. FIG. 15 illustrates distribution of the number of fine particles in front view of the surface 52F of the spheroid reflective layer 52. In FIG. 15, an opening that is formed at the EUV light condensing mirror 50 and through which the laser beam 301 propagates is omitted. As described above, the protective layer 55 includes the first protective layer 56 and the second protective layer 57. In FIG. 15, the first protective layer 56 and the second protective layer 57 are hatched in directions different from each other.

In FIG. 15, each numerical value written on the surface 52F of the reflective layer 52 is a value of the curve representing the number of fine particles in FIG. 14. In the present embodiment, the first region is a region in which the scattering number of fine particles on the surface 52F of the reflective layer 52 is equal to or smaller than a predetermined number. In the example of FIG. 15, the first region is a region in which the scattering number is equal to or smaller than 0.7, and the first protective layer 56 is disposed in the first region. As described with reference to FIG. 14, the angle θ and the scattering number of fine particles are correlated. In the present embodiment, like the example of FIG. 15, the region in which the scattering number is equal to or smaller than 0.7 is a region in which the angle θ is equal to or smaller than 36.4°, and thus the first region in which the first protective layer 56 illustrated in FIG. 15 is disposed is a region in which the angle θ is equal to or smaller than 36.4°. In other words, the first region in which the first protective layer 56 is disposed in the present embodiment is a region in which the angle θ between the optical axis LC of the laser beam 301 and the line connecting the surface 52F of the reflective layer 52 and the focusing position of the laser beam 301 is equal to or smaller than a predetermined angle. In this manner, the angle θ can serve as an index for the number of fine particles scattering to the EUV light condensing mirror 50.

Similarly to Embodiment 1, the second region is a region other than the first region on the surface 52F of the reflective layer 52, and the second protective layer 57 is disposed in the second region.

As understood from FIG. 15, in the present embodiment, when the first region is defined as described above, the first region is a region within a predetermined range from the center C on the surface 52F of the reflective layer 52 and has a rotationally symmetric shape with respect to the center C and a symmetric shape with respect to line L1. Thus, the first protective layer 56, as well, is a region within the predetermined range from the center C and has a rotationally symmetric shape with respect to the center C and a symmetric shape with respect to line L1. Accordingly, the first protective layer 56 has a circular outer periphery in front view of the EUV light condensing mirror 50. The second region is a region surrounding the first region, and the second protective layer 57 surrounds the first protective layer 56.

Similarly to the protective layer 55 of Embodiment 1, the protective layer 55 of the present embodiment may have a section in a status same as that in the example illustrated in FIG. 5 or the example illustrated in FIG. 9. Thus, the method of manufacturing the protective layer 55 may be same as the method of manufacturing the protective layer 55 described in Embodiment 1.

Furthermore, in the present embodiment as well, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

8.2 Effect

It is thought from FIG. 14 that fine particles generated through plasma generation from the droplet DL in the plasma generation region AR are more likely to collide with the EUV light condensing mirror 50 in a region closer to the optical axis LC of the laser beam 301. Thus, it is thought that the number of fine particles is larger and the energy of charged particles is higher as the angle θ is smaller.

In the present embodiment, as described above, the first region in which the first protective layer 56 is disposed is a region in which the angle θ between the optical axis LC of the laser beam 301 and the line connecting the surface 52F of the reflective layer 52 and the focusing position of the laser beam 301 is equal to or smaller than a predetermined angle. Thus, the first protective layer 56 unlikely to be scraped by collision with charged particles is disposed in a region in which charged particles are likely to collide on the surface 52F of the reflective layer 52. Accordingly, the reflective layer 52 can be prevented from being exposed from the protective layer 55. Thus, it is possible to reduce decrease of the reflectance of the EUV light condensing mirror 50 due to accumulation of fine particles on the reflective layer 52 through exposure of the reflective layer 52.

In the present embodiment, the first region and the second region are defined irrespective of the magnetic field ML. Thus, the EUV light condensing mirror 50 of the present embodiment is also applicable to an EUV light generation apparatus not including the magnetic field generation unit 65. In the EUV light generation apparatus not including the magnetic field generation unit 65, fine particles in the chamber 10 can be discharged from the discharge unit 61 through, for example, gas flow caused by the etching gas introduction and the residual gas ejection.

9. Description of EUV Light Condensing Mirror of Embodiment 5

The following describes the configuration of an EUV light condensing mirror of Embodiment 5. A component same as a component in the above description is denoted by the same reference sign, and duplicate description thereof will be omitted except for a case in which specific description is needed.

9.1 Configuration

The EUV light condensing mirror 50 of the present embodiment is different from the EUV light condensing mirror 50 of each embodiment described above in that the first region is defined based on combination of two factors below. The first factor is distance D1 between the magnetic field axis MA and the surface 52F of the reflective layer 52, which is described in Embodiment 1. The second factor is distance D2 between the focusing position of the laser beam 301 and the surface 52F of the reflective layer 52, which is described in Embodiment 3.

Figure 16:
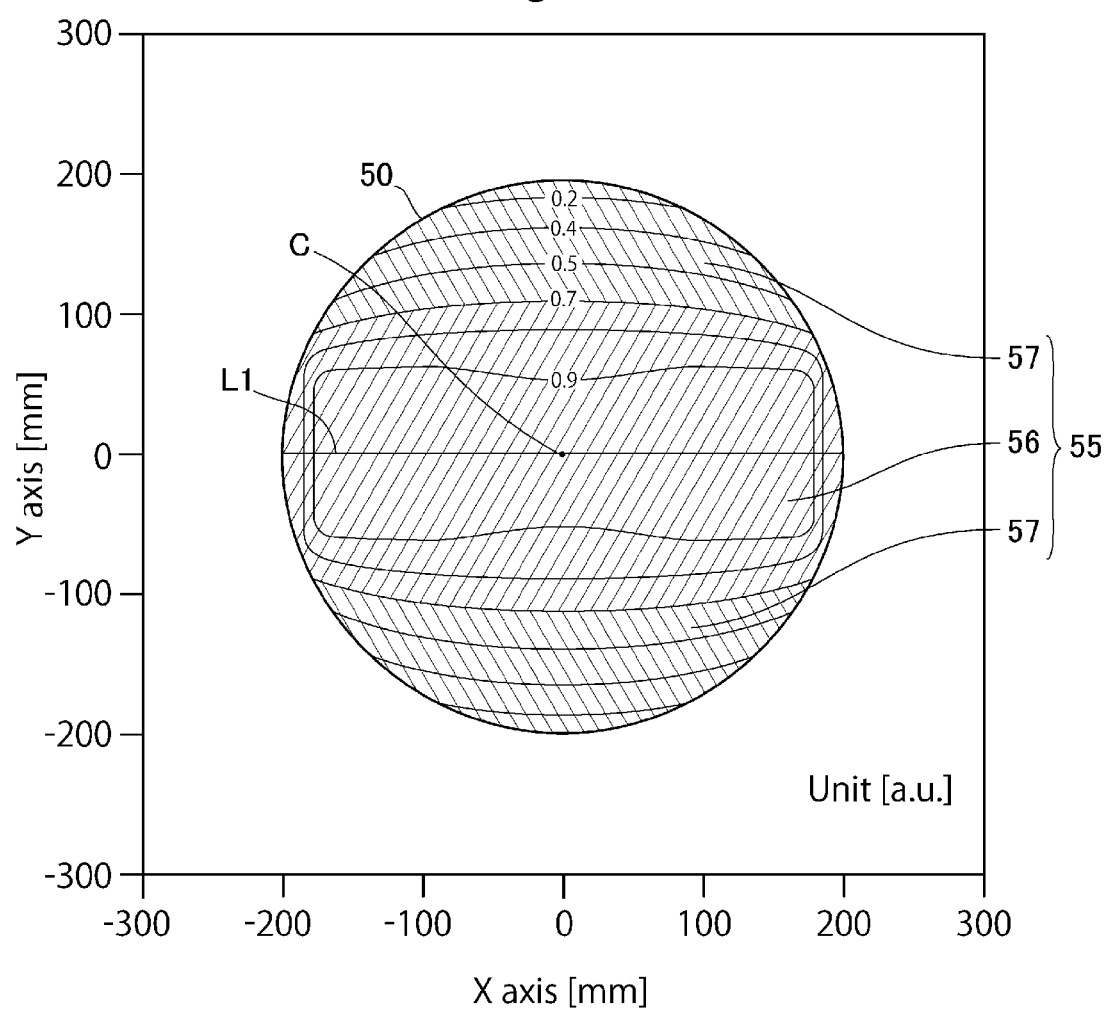
FIG. 16 is a diagram illustrating distribution of a coefficient obtained by normalizing and summing distance D1 illustrated in FIG. 6 and distance D2 illustrated in FIG. 11, and the status of the protective layer of the extreme ultraviolet light condensing mirror of Embodiment 5.

FIG. 16 is a diagram illustrating distribution of a value obtained by normalizing and summing distance D1 illustrated in FIG. 6 and distance D2 illustrated in FIG. 11, and the status of the protective layer 55 of the EUV light condensing mirror 50 of the present embodiment. FIG. 16 illustrates distribution of the value obtained by normalizing and summing distances D1 and D2 in front view of the surface 52F of the spheroid reflective layer 52. In FIG. 16, an opening that is formed at the EUV light condensing mirror 50 and through which the laser beam 301 propagates is omitted. As described above, the protective layer 55 includes the first protective layer 56 and the second protective layer 57. In FIG. 16, the first protective layer 56 and the second protective layer 57 are hatched in directions different from each other.

The value obtained by normalizing and summing distance D1 illustrated in FIG. 6 and distance D2 illustrated in FIG. 11 can be obtained by Expression (1) below.

$$R = a\left(\frac{D1 - D1_{max}}{D1_{min} - D1_{max}}\right) + c\left(\frac{D2 - D2_{max}}{D2_{min} - D2_{max}}\right) \quad (1)$$

In Expression (1), R represents the above-described value. In Expression (1), as described in Embodiment 1, D1 is a variable representing the distance from an optional position on the surface 52F of the reflective layer 52 to the magnetic field axis MA, $D1_{min}$ represents the minimum value of distance D1, and $D1_{max}$ represents the maximum value of distance D1. In Expression (1), D2 is same as distance D2 as described in Embodiment 3 and is a variable representing the distance from an optional position on the surface 52F of the reflective layer 52 to the focal point of the laser beam 301 as described in Embodiment 1, $D2_{min}$ represents the minimum value of distance D2, and $D2_{max}$ represents the maximum value of distance D2. In Expression (1), a represents a weight coefficient of distance D1, and c represents a weight coefficient of distance D2. The weight coefficient c may be larger than the weight coefficient a. In the present embodiment, as in Expression (1), distances D1 and D2 are normalized, the normalized D1 is multiplied by the weight coefficient a, and the normalized D2 is multiplied by the weight coefficient c. The value R is a resulting value of summation of the multiplication results.

As described in Embodiment 1, it is thought that the number of charged particles scattering to the EUV light condensing mirror 50 is larger as distance D1 is shorter. Further, as described in Embodiment 3, it is thought that the number of fine particles colliding with the EUV light condensing mirror 50 is larger as distance D2 is smaller. Furthermore, as understood from Expression (1), the values of the first and second terms on the right-hand side of Expression (1) are larger as the values of distances D1 and D2, respectively, are smaller. Thus, it is thought that, as the value R is larger, the number of fine particles scattering to the EUV light condensing mirror 50 is larger and the energy of the fine particles is larger. The value R is written in FIG. 16. In the present embodiment, the first region is a region in which the value R in Expression (1) is equal to or larger than a predetermined value on the surface 52F of the reflective layer 52.

In the example of FIG. 16, the first region is a region in which the value R is equal to or larger than 0.7 on the surface 52F of the reflective layer 52, and the first protective layer 56 is disposed in the first region. Similarly to Embodiment 1, the second region is a region other than the first region on the surface 52F of the reflective layer 52. Thus, the second protective layer 57 is disposed in the second region in which the value R is smaller than 0.7 on the surface 52F of the reflective layer 52.

As understood from FIG. 16, in the present embodiment, when the first region is defined as described above, the first region extends from one end part of line L1 along the magnetic field axis MA on the surface 52F of the reflective layer 52 to the other end part. Thus, the first protective layer 56, as well, extends from one end part of line L1 to the other end part and has a symmetric shape with respect to line L1. The second region is positioned on one side and the other side of line L1 and has a symmetric shape with respect to line L1. Thus, the second protective layer 57, as well, is disposed on one side and the other side of line L1 along the magnetic field axis MA on the surface 52F of the reflective layer 52 and has a symmetric shape with respect to line L1 along the magnetic field axis MA. As understood from FIG. 16, when the first region is a region in which the value R is equal to or larger than 0.9 on the surface 52F of the reflective layer 52, the first region is a region overlapping line L1 except for one end part and the other end part of line L1.

Similarly to the protective layer 55 of Embodiment 1, the protective layer 55 of the present embodiment may have a section in a status same as that in the example illustrated in FIG. 5 or the example illustrated in FIG. 9. Thus, the method of manufacturing the protective layer 55 may be same as the method of manufacturing the protective layer 55 described in Embodiment 1.

Furthermore, in the present embodiment as well, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

9.2 Effect

As described above, charged particles generated through plasma generation from the droplet DL in the plasma generation region AR converge toward the wall of the chamber 10 under influence of the magnetic field ML, but some charged particles collide with the EUV light condensing mirror 50. Electrically neutral fine particles generated through the plasma generation are not affected by the magnetic field ML and thus are likely to diffuse.

Thus, distance D1 between the magnetic field axis MA and the surface 52F of the reflective layer 52 is likely to reflect a tendency that charged particles affected by the magnetic field ML are more likely to collide with the EUV light condensing mirror 50 than electrically neutral fine particles unlikely to be affected by the magnetic field ML. Distance D2 between the focal point of the laser beam 301 as the plasma point PP and the surface 52F of the reflective layer 52 is likely to reflect a tendency that electrically neutral fine particles collide with the EUV light condensing mirror 50.

In the protective layer 55 in the present embodiment, these two factors are reflected such that the first protective layer 56 unlikely to be scraped by collision with fine particles is disposed in the first region in which fine particles are thought to be likely to collide with the EUV light condensing mirror 50. Accordingly, the reflective layer 52 can be prevented from being exposed from the protective layer 55. Thus, it is possible to reduce decrease of the reflectance of the EUV light condensing mirror 50 due to accumulation of fine particles on the reflective layer 52 through exposure of the reflective layer 52.

10. Description of EUV Light Condensing Mirror of Embodiment 6

The following describes the configuration of an EUV light condensing mirror of Embodiment 6. A component same as a component in the above description is denoted by the same reference sign, and duplicate description thereof will be omitted except for a case in which specific description is needed.

10.1 Configuration

The EUV light condensing mirror 50 of the present embodiment is different from the EUV light condensing mirror 50 of each embodiment described above in that the first region is defined based on combination of two factors below. The first factor is the magnetic flux density of the magnetic field ML on the surface 52F of the reflective layer 52, which is described in Embodiment 2. The second factor is distance D2 between the focusing position of the laser beam 301 and the surface 52F of the reflective layer 52, which is described in Embodiment 3.

Figure 17:
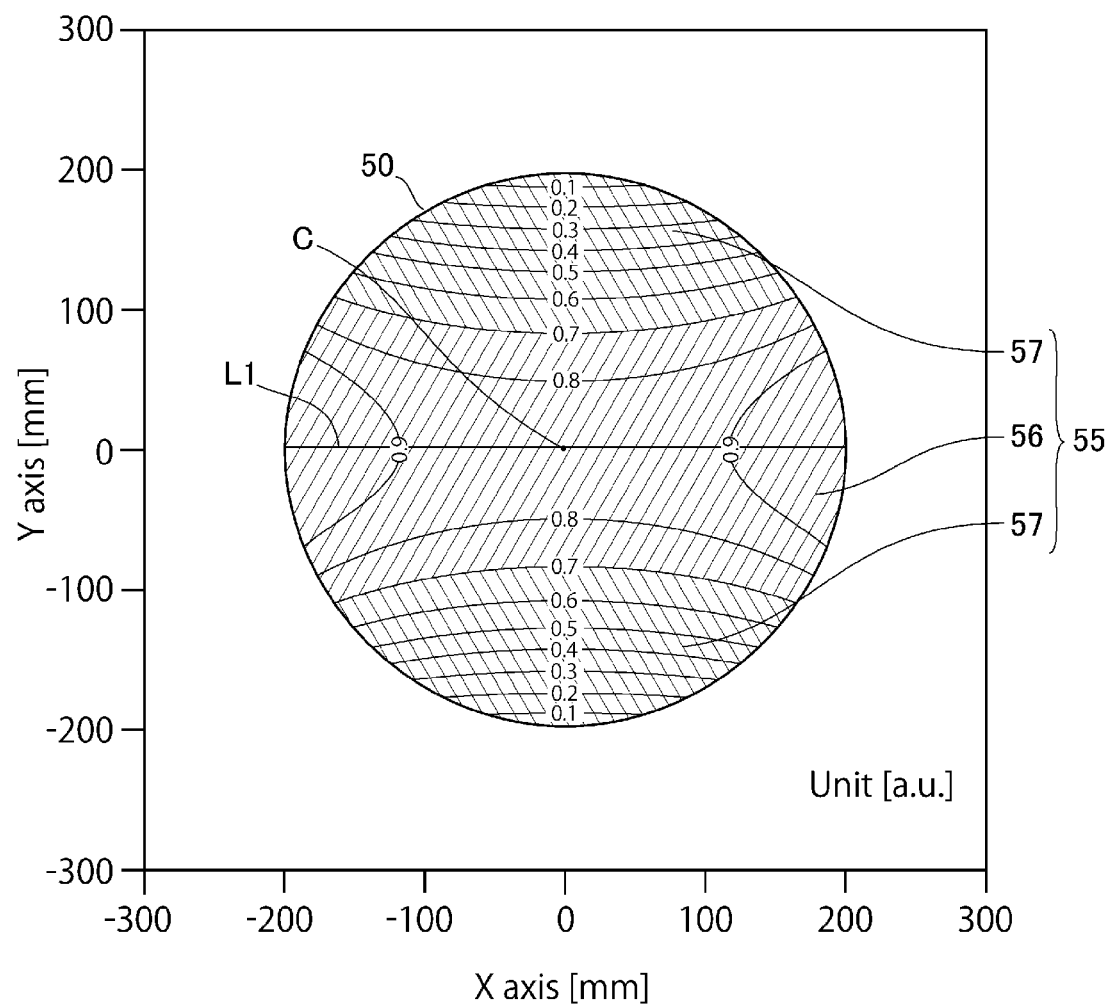
FIG. 17 is a diagram illustrating distribution of a value obtained by normalizing and summing the magnetic flux density on the surface of the reflective layer illustrated in FIG. 10 and the distance illustrated in FIG. 11, and the status of the protective layer of the extreme ultraviolet light condensing mirror of Embodiment 6.

FIG. 17 is a diagram illustrating distribution of a value obtained by normalizing and summing the magnetic flux density on the surface 52F of the reflective layer 52 illustrated in FIG. 10 and distance D2 illustrated in FIG. 11, and the status of the protective layer 55 of the EUV light condensing mirror 50 of the present embodiment. FIG. 17 illustrates, in front view of the surface 52F of the spheroid reflective layer 52, distribution of the value obtained by normalizing and summing the magnetic flux density and distance D2. In FIG. 17, an opening that is formed at the EUV light condensing mirror 50 and through which the laser beam 301 propagates is omitted. As described above, the protective layer 55 includes the first protective layer 56 and the second protective layer 57. In FIG. 17, the first protective layer 56 and the second protective layer 57 are hatched in directions different from each other.

The value obtained by normalizing and summing the magnetic flux density illustrated in FIG. 10 and distance D2 illustrated in FIG. 11 can be obtained by Expression (2) below.

$$R = b\left(\frac{B - B_{max}}{B_{min} - B_{max}}\right) + c\left(\frac{D2 - D2_{max}}{D2_{min} - D2_{max}}\right) \quad (2)$$

In Expression (2), R represents the above-described value. In Expression (2), B is a variable representing the magnetic flux density at an optional position on the surface 52F of the reflective layer 52 illustrated in FIG. 10 as described in Embodiment 2, $B_{min}$ represents the minimum value of the magnetic flux density B, and $B_{max}$ represents the maximum value of the magnetic flux density B. In Expression (2), b represents a weight coefficient of the magnetic flux density B. In Expression (2), D2, $D2_{min}$, $D2_{max}$, and c are same as D2, $D2_{min}$, $D2_{max}$, and c in Expression (1) described above. The weight coefficient c may be larger than the weight coefficient b. In the present embodiment, as in Expression (2), the magnetic flux density B and distance D2 are normalized, the normalized B is multiplied by the weight coefficient b, and the normalized D2 is multiplied by the weight coefficient c. The value R is a resulting value of summation of the multiplication results.

As described in Embodiment 2, it is thought that the number of charged particles scattering to the EUV light condensing mirror 50 is larger as the magnetic flux density B is smaller. Further, as described in Embodiment 3, it is thought that the number of fine particles colliding with the EUV light condensing mirror 50 is larger as distance D2 is smaller. Furthermore, as understood from Expression (2), the values of the first and second terms on the right-hand side of Expression (2) are larger as the values of the magnetic flux density B and distance D2, respectively, are smaller. Thus, it is thought that, as the value R is larger, the number of fine particles scattering to the EUV light condensing mirror 50 is larger and the energy of the fine particles is larger. The value R is written in FIG. 17. In the present embodiment, the first region is a region in which the value R of Expression (2) is equal to or larger than a predetermined value on the surface 52F of the reflective layer 52.

In the example of FIG. 17, the first region is a region in which the value R is equal to or larger than 0.7 on the surface 52F of the reflective layer 52, and the first protective layer 56 is disposed in the first region. Similarly to Embodiment 1, the second region is a region other than the first region on the surface 52F of the reflective layer 52. Thus, the second protective layer 57 is disposed in the second region in which the value R is smaller than 0.7 on the surface 52F of the reflective layer 52.

As understood from FIG. 17, in the present embodiment, when the first region is defined as described above, the first region extends from one end part of line L1 along the magnetic field axis MA on the surface 52F of the reflective layer 52 to the other end part and has a symmetric shape with respect to line L1. Thus, the first protective layer 56, as well, extends from one end part of line L1 to the other end part and has a symmetric shape with respect to line L1. The second region is positioned on one side and the other side of line L1 and has a symmetric shape with respect to line L1. Thus, the second protective layer 57, as well, is disposed on one side and the other side of line L1 and has a symmetric shape with respect to line L1 along the magnetic field axis MA. As understood from FIG. 17, when the first region is a region in which the value R is equal to or larger than 0.9 on the surface 52F of the reflective layer 52, the first region includes one end part and the other end part of line L1 but does not include a region near the center C on line L1.

Similarly to the protective layer 55 of Embodiment 1, the protective layer 55 of the present embodiment may have a section in a status same as that in the example illustrated in FIG. 5 or the example illustrated in FIG. 9. Thus, the method of manufacturing the protective layer 55 may be same as the method of manufacturing the protective layer 55 described in Embodiment 1.

Furthermore, in the present embodiment as well, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

10.2 Effect

As described above, it is thought that, when the force received from the magnetic field ML is small, the charged particles are likely to collide with the EUV light condensing mirror 50 as described in Embodiment 2. Electrically neutral fine particles generated through the plasma generation are not affected by the magnetic field ML and thus are likely to diffuse.

Thus, the magnetic flux density B on the surface 52F of the reflective layer 52 is likely to reflect a tendency that charged particles affected by the magnetic field ML are more likely to collide with the EUV light condensing mirror 50 than electrically neutral fine particles unlikely to be affected by the magnetic field ML. Distance D2 between the focal point of the laser beam 301 as the plasma point PP and the surface 52F of the reflective layer 52 is likely to reflect a tendency that electrically neutral fine particles collide with the EUV light condensing mirror 50.

In the protective layer 55 in the present embodiment, these two factors are reflected such that the first protective layer 56 unlikely to be scraped by collision with fine particles is disposed in the first region in which fine particles are thought to be likely to collide with the EUV light condensing mirror 50. Accordingly, the reflective layer 52 can be prevented from being exposed from the protective layer 55. Thus, it is possible to reduce decrease of the reflectance of the EUV light condensing mirror 50 due to accumulation of fine particles on the reflective layer 52 through exposure of the reflective layer 52.

11. Description of EUV Light Condensing Mirror of Embodiment 7

The following describes the configuration of an EUV light condensing mirror of Embodiment 7. A component same as a component in the above description is denoted by the same reference sign, and duplicate description thereof will be omitted except for a case in which specific description is needed.

11.1 Configuration

The EUV light condensing mirror 50 of the present embodiment is different from the EUV light condensing mirror 50 of each embodiment described above in that the first region is defined based on combination of four factors below. The first factor is distance D1 between the magnetic field axis MA and the surface 52F of the reflective layer 52 in Embodiment 1. The second factor is the magnetic flux density of the magnetic field ML on the surface 52F of the reflective layer 52 in Embodiment 2. In the present embodiment, similarly to Embodiment 6, the magnetic flux density is denoted by B. The third factor is distance D2 between the focusing position of the laser beam 301 and the surface 52F of the reflective layer 52 in Embodiment 3. The fourth factor is the angle θ between the optical axis of the laser beam and a line connecting the surface of the reflective layer and the focusing position of the laser beam in Embodiment 4.

Figure 18:
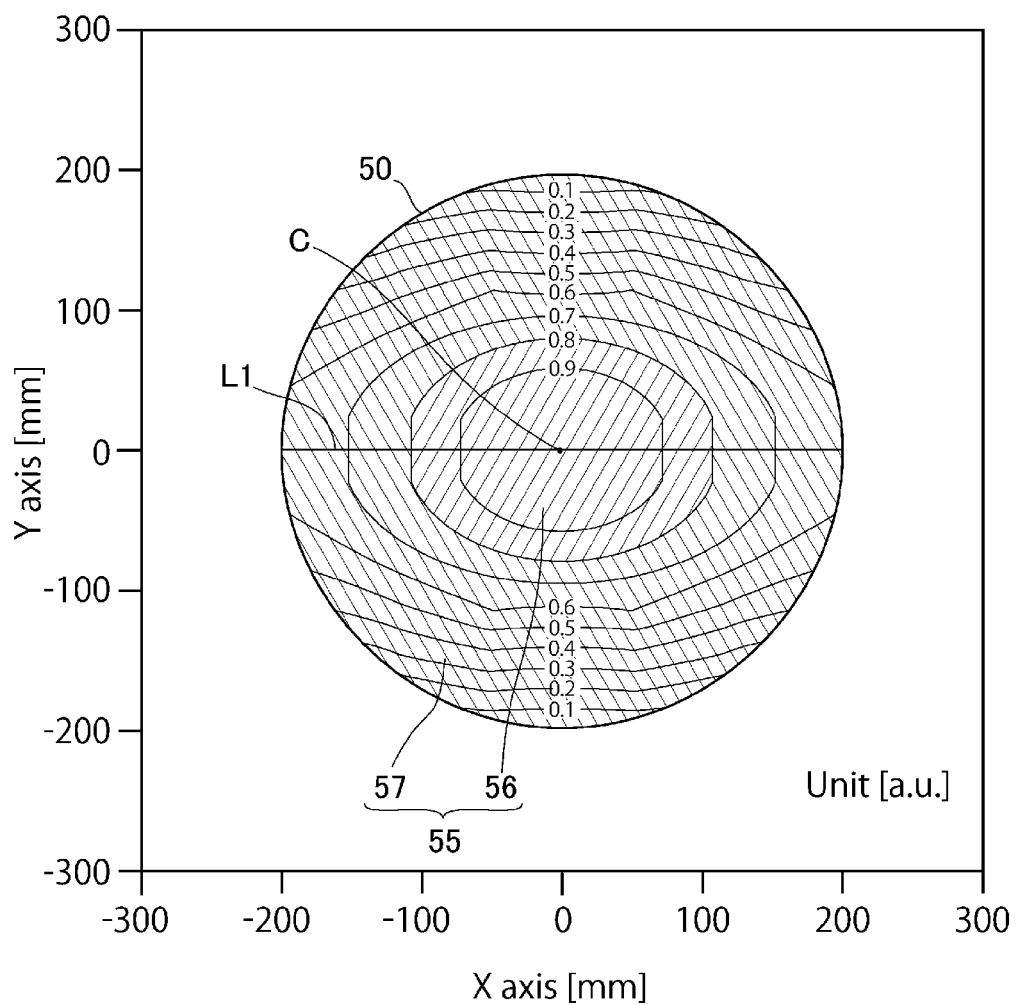
FIG. 18 is a diagram illustrating distribution of a value obtained by normalizing and summing distance D1 illustrated in FIG. 6, magnetic flux density B on the surface of the reflective layer illustrated in FIG. 10, distance D2 illustrated in FIG. 11, and the number of fine particles scattering to the extreme ultraviolet light condensing mirror illustrated in FIG. 14, and the status of the protective layer of the extreme ultraviolet light condensing mirror of Embodiment 7.

FIG. 18 is a diagram illustrating distribution of a value obtained by normalizing and summing distance D1 illustrated in FIG. 6, the magnetic flux density B on the surface 52F of the reflective layer 52 illustrated in FIG. 10, distance D2 illustrated in FIG. 11, and the number of fine particles scattering to the EUV light condensing mirror 50 illustrated in FIG. 14, and the status of the protective layer 55 of the EUV light condensing mirror 50 of the present embodiment. FIG. 18 illustrates, in front view of the surface 52F of the spheroid reflective layer 52, distribution of a value obtained by normalizing and summing distance D1, the magnetic flux density B, distance D2, and the angle θ as an index for the number of fine particles. In FIG. 18, an opening that is formed at the EUV light condensing mirror 50 and through which the laser beam 301 propagates is omitted. As described above, the protective layer 55 includes the first protective layer 56 and the second protective layer 57. In FIG. 18, the first protective layer 56 and the second protective layer 57 are hatched in directions different from each other.

The value obtained by normalizing and summing distance D1 illustrated in FIG. 6, the magnetic flux density B on the surface 52F of the reflective layer 52 illustrated in FIG. 10, distance D2 illustrated in FIG. 11, and the angle θ illustrated in FIG. 14 can be obtained by Expression (3) below.

$$R = a\left(\frac{D1 - D1_{max}}{D1_{min} - D1_{max}}\right) + b\left(\frac{B - B_{min}}{B_{max} - B_{min}}\right) + c\left(\frac{D2 - D2_{max}}{D2_{min} - D2_{max}}\right) + d\left(\frac{\theta - \theta_{max}}{\theta_{min} - \theta_{max}}\right) \quad (3)$$

In Expression (3), R represents the above-described value. In Expression (3), D1, $D1_{min}$, $D1_{max}$, and a are same as D1, $D1_{min}$, $D1_{max}$, and a in Expression (1). In Expression (3), B, $B_{min}$, $B_{max}$, and b are same as B, $B_{min}$, $B_{max}$, and b in Expression (2). In Expression (3), D2, $D2_{min}$, $D2_{max}$, and c are same as D2, $D2_{min}$, $D2_{max}$, and c in Expression (1). In Expression (3), as described in Embodiment 4, θ is a variable representing the angle between the optical axis of the laser beam and the line connecting the surface of the reflective layer and the focusing position of the laser beam, which is illustrated in FIG. 13, $\theta_{min}$ represents the minimum value of the angle θ, and $\theta_{max}$ represents the maximum value of the angle θ. In Expression (3), d represents a weight coefficient of the angle θ. In Embodiment 5, it is described that the weight coefficient c may be larger than the weight coefficient a. In Embodiment 6, it is described that the weight coefficient c may be larger than the weight coefficient b. However, in the present embodiment, the weight coefficient c may be smaller than the weight coefficient a and the weight coefficient b. In addition, in the present embodiment, the weight coefficient d may be largest.

In the present embodiment, as in Expression (3), distance D1, the magnetic flux density B, distance D2, and the angle θ are normalized. Then, the normalized D1 is multiplied by the weight coefficient a, the normalized B is multiplied by the weight coefficient b, the normalized D2 is multiplied by the weight coefficient c, and the normalized θ is multiplied by the weight coefficient d. The value R is a resulting value of summation of the multiplication results.

As described in Embodiment 1, it is thought that the number of charged particles scattering to the EUV light condensing mirror 50 is larger as distance D1 is smaller. As described in Embodiment 2, it is thought that the number of charged particles scattering to the EUV light condensing mirror 50 is larger as the magnetic flux density B is smaller. As described in Embodiment 3, it is thought that the number of fine particles colliding with the EUV light condensing mirror 50 is larger as distance D2 is smaller. As described in Embodiment 4, the number of fine particles colliding with the EUV light condensing mirror 50 is larger as the angle θ is smaller. The values of the first to fourth terms on the right-hand side of Expression (3) are larger as the values of distance D1, the magnetic flux density B, distance D2, and the angle θ, respectively, are smaller. Thus, it is thought that, as the value R is larger, the number of fine particles scattering to the EUV light condensing mirror 50 is larger and the energy of the fine particles is larger. The value R is written in FIG. 18. In the present embodiment, the first region is a region in which the value R of Expression (3) is equal to or larger than a predetermined value on the surface 52F of the reflective layer 52.

In the example of FIG. 18, the first region is a region in which the value R is equal to or larger than 0.8 on the surface 52F of the reflective layer 52, and the first protective layer 56 is disposed in the first region. Similarly to the above-described embodiments, the second region is a region other than the first region on the surface 52F of the reflective layer 52. Thus, the second protective layer 57 is disposed in the second region in which the value R is larger than 0.8 on the surface 52F of the reflective layer 52.

As understood from FIG. 18, in the present embodiment, when the first region is defined as described above, the first region is a region overlapping line L1 along the magnetic field axis MA on the surface 52F of the reflective layer 52 except for one end part and the other end part of line L1. In the example of FIG. 18, the first region has a substantially ellipse shape with its long axis positioned on line L1 and has a symmetric shape with respect to line L1. Thus, the first protective layer 56, as well, has a substantially ellipse shape and has a symmetric shape with respect to line L1. The second region has a shape surrounding the first region and has a symmetric shape with respect to line L1. Thus, the second protective layer 57 has a shape surrounding the first protective layer 56 and has a symmetric shape with respect to line L1. As understood from FIG. 18, when the first region is, for example, a region in which the value R is equal to or larger than 0.6 on the surface 52F of the reflective layer 52, the first region extends from one end part of line L1 along the magnetic field axis MA on the surface 52F of the reflective layer 52 to the other end part. Thus, the first protective layer 56, as well, extends from one end part to the other end part of line L1.

Similarly to the protective layer 55 of Embodiment 1, the protective layer 55 of the present embodiment may have a section in a status same as that in the example illustrated in FIG. 5 or the example illustrated in FIG. 9. Thus, the method of manufacturing the protective layer 55 may be same as the method of manufacturing the protective layer 55 described in Embodiment 1.

Furthermore, in the present embodiment as well, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

11.2 Effect

As described above, charged particles generated through plasma generation from the droplet DL in the plasma generation region AR converge toward the wall of the chamber 10 under influence of the magnetic field ML, but some charged particles collide with the EUV light condensing mirror 50. Electrically neutral fine particles generated through the plasma generation are not affected by the magnetic field ML and thus are likely to diffuse.

Thus, distance D1 between the magnetic field axis MA and the surface 52F of the reflective layer 52 and the magnetic flux density B on the surface 52F of the reflective layer 52 are likely to reflect a tendency that charged particles affected by the magnetic field ML are more likely to collide with the EUV light condensing mirror 50 than electrically neutral fine particles. Distance D2 between the focal point of the laser beam 301 and the surface 52F of the reflective layer 52 and the angle θ between the optical axis of the laser beam and the line connecting the surface 52F of the reflective layer 52 and the focusing position of the laser beam are likely to reflect a tendency that electrically neutral fine particles collide with the EUV light condensing mirror 50.

In the protective layer 55 in the present embodiment, these four factors are reflected such that the first protective layer 56 unlikely to be scraped by collision with fine particles is disposed in the first region in which fine particles are thought to be likely to collide with the EUV light condensing mirror 50. Accordingly, the reflective layer 52 can be prevented from being exposed from the protective layer 55. Thus, it is possible to reduce decrease of the reflectance of the EUV light condensing mirror 50 due to accumulation of fine particles on the reflective layer 52 through exposure of the reflective layer 52.

The first region is defined based on distances D1 and D2 in Embodiment 5, the first region is defined based on the magnetic flux density B and distance D2 in Embodiment 6, and the first region is defined based on distance D1, the magnetic flux density B, distance D2, and the angle θ in the present embodiment. However, the first region may be defined based on combination other than combination of factors selected in each embodiment from among the four factors of distance D1, the magnetic flux density B, distance D2, and the angle θ. For example, the first region may be defined based on distance D1, the magnetic flux density B, and distance D2. Alternatively, the first region may be defined based on the magnetic flux density B and the angle θ.

12. Description of EUV Light Condensing Mirror of Embodiment 8

The Following describes the configuration of an EUV light condensing mirror of Embodiment 8. A component same as a component in the above description is denoted by the same reference sign, and duplicate description thereof will be omitted except for a case in which specific description is needed.

12.1 Configuration

The EUV light condensing mirror 50 of the present embodiment is different from that in the above-described embodiments in the following point. In the above-described embodiments, the first region has a symmetric shape with respect to line L1. However, in the present embodiment, the first region is shifted, with respect to line L1 along the magnetic field axis MA on the surface 52F of the reflective layer 52, in the direction of force that charged particles generated through plasma generation from the target substance receives from the magnetic field ML between the magnetic field axis MA and the EUV light condensing mirror 50. In the present embodiment, the following describes a case in which the present embodiment is applied to Embodiment 3.

Figure 19:
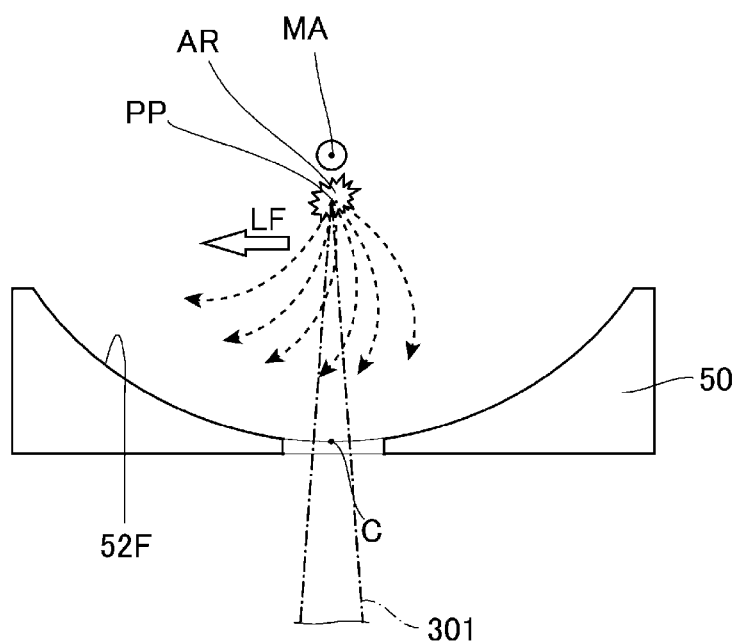
FIG. 19 is a diagram of the extreme ultraviolet light condensing mirror when viewed along the magnetic field axis.

FIG. 19 is a diagram of the EUV light condensing mirror 50 when viewed along the magnetic field axis MA. Although the magnetic field axis MA passes through the plasma generation region AR as described above, the plasma generation region AR and the magnetic field axis MA are offset from each other in illustration of FIG. 19 for simplification of the drawing. As described above, charged particles are generated when the droplet DL is irradiated with the laser beam 301 in the plasma generation region AR. Each charged particle moves in a helical shape while receiving Lorentz force from the magnetic field ML. Thus, as illustrated with dashed line arrows in FIG. 19, charged particles scattering to the EUV light condensing mirror 50 can scatter while being curved in the direction of Lorentz force LF received from the magnetic field ML between the magnetic field axis MA and the EUV light condensing mirror 50. Thus, among fine particles scattering to the EUV light condensing mirror 50 described in Embodiment 3, charged particles can scatter to the EUV light condensing mirror 50 while being deflected in the direction of the Lorentz force LF received from the magnetic field ML between the magnetic field axis MA and the EUV light condensing mirror 50. Hereinafter, the direction of the Lorentz force LF that charged particles receives from the magnetic field ML between the magnetic field axis MA and the EUV light condensing mirror 50 is also simply referred to as the direction of the Lorentz force LF received by charged particles.

FIG. 20 is a diagram illustrating distribution of distance D2 between the surface 52F of the reflective layer 52 and the focusing position of the laser beam 301, and the status of the protective layer 55 of the EUV light condensing mirror 50 of the present embodiment. This distribution of distance D2 is distribution of distance D2 in Embodiment 3 described with reference to FIG. 12. The direction of the Lorentz force LF illustrated in FIG. 19 is illustrated in FIG. 20. FIG. 20 illustrates the distance distribution in front view of the surface 52F of the spheroid reflective layer 52. In FIG. 20, an opening that is formed at the EUV light condensing mirror 50 and through which the laser beam 301 propagates is omitted. As described above, the protective layer 55 includes the first protective layer 56 and the second protective layer 57. In FIG. 20, the first protective layer 56 and the second protective layer 57 are hatched in directions different from each other.

In FIG. 20, each numerical value written on the surface 52F of the reflective layer 52 indicates distance D2. In the present embodiment, the first region is a region obtained by shifting, in the direction of the Lorentz force LF received by charged particles, a region in which distance D2 between the surface 52F of the reflective layer 52 and the focusing position of the laser beam 301 is equal to or shorter than a predetermined distance on the surface 52F of the reflective layer 52. In Embodiment 3, the first region includes the center C on the surface 52F of the reflective layer 52 and has a rotationally symmetric shape with respect to the center C and a symmetric shape with respect to line L1. However, in the present embodiment, the first region of Embodiment 3 is shifted in the direction of the Lorentz force LF received by charged particles. Accordingly, the first region of the present embodiment is shifted in the direction of the Lorentz force received by charged particles as described above. Thus, the first protective layer 56, as well, is shifted in the direction of the Lorentz force LF received by charged particles as illustrated in FIG. 20. As a result, the second region is shifted in the direction opposite to the direction of the Lorentz force LF received by charged particles, and the second protective layer 57, as well, is shifted in the direction opposite to the direction of the Lorentz force LF received by charged particles.

Similarly to the protective layer 55 of Embodiment 1, the protective layer 55 of the present embodiment may have a section in a status same as that in the example illustrated in FIG. 5 or the example illustrated in FIG. 9. Thus, the method of manufacturing the protective layer 55 may be same as the method of manufacturing the protective layer 55 described in Embodiment 1.

Furthermore, in the present embodiment as well, the thicknesses of the first protective layer 56 and the second protective layer 57 may be determined as appropriate in accordance with the intensity and pulse repetition frequency of the laser beam 301 and the like. The thicknesses of the first protective layer 56 and the second protective layer 57 may be different from each other or may be equal to each other.

12.2 Effect

As described above, among fine particles generated through plasma generation from the droplet DL in the plasma generation region AR, charged particles receive Lorentz force between the magnetic field axis MA and the EUV light condensing mirror 50. Thus, charged particles scattering to the EUV light condensing mirror 50 are deflected in the direction of the Lorentz force LF received by charged particles with respect to line L1 along the magnetic field axis MA on the surface 52F of the reflective layer 52.

In the present embodiment, as described above, the first region in which the first protective layer 56 is disposed is shifted in the direction of force that charged particles receive from the magnetic field ML between the magnetic field axis MA and the EUV light condensing mirror 50. Thus, the first protective layer 56 unlikely to be scraped by collision with charged particles is disposed in a region in which charged particles are thought to be likely to collide on the surface 52F of the reflective layer 52. Accordingly, the reflective layer 52 can be prevented from being exposed from the protective layer 55. Thus, it is possible to reduce decrease of the reflectance of the EUV light condensing mirror 50 due to accumulation of fine particles on the reflective layer 52 through exposure of the reflective layer 52.

In the present embodiment, the first region in Embodiment 3 is shifted in the direction of the Lorentz force LF received by charged particles. However, the first region in each above-described embodiment other than Embodiment 3 may be shifted in the direction of the Lorentz force LF received by charged particles.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus comprising:
    a chamber having an internal space in which a laser beam is condensed and plasma is generated from a target substance at a focusing position of the laser beam;
    a condensing mirror configured to condense extreme ultraviolet light generated through the plasma generation from the target substance; and
    a magnetic field generation unit configured to generate a magnetic field having a magnetic field axis intersecting a reflected light path of the condensing mirror, the condensing mirror including a substrate, a reflective layer provided on the substrate to reflect the extreme ultraviolet light, and a protective layer provided on the reflective layer, the protective layer including a first protective layer disposed in a first region including at least part of a line extending through a center of the condensing mirror along the magnetic field axis on a surface of the reflective layer, and a second protective layer disposed in a second region other than the first region on the surface of the reflective layer, a material of the first protective layer being less dense than a material of the second protective layer, the material of the second protective layer having a transmittance for the extreme ultraviolet light higher than a transmittance for the extreme ultraviolet light of the material of the first protective layer.

2. The extreme ultraviolet light generation apparatus according to claim 1, wherein the second protective layer is disposed between the reflective layer and the first protective layer in the first region.

3. The extreme ultraviolet light generation apparatus according to claim 1, wherein the first region is a region in which a distance between the magnetic field axis and the surface of the reflective layer is equal to or shorter than a predetermined distance.

4. The extreme ultraviolet light generation apparatus according to claim 3, wherein the first region includes an end part of the line along the magnetic field axis on the surface of the reflective layer.

5. The extreme ultraviolet light generation apparatus according to claim 4, wherein the first region extends from one end part of the line along the magnetic field axis on the surface of the reflective layer to the other end part.

6. The extreme ultraviolet light generation apparatus according to claim 1, wherein the first region is a region in which a magnetic flux density of the magnetic field on the surface of the reflective layer is equal to or lower than a predetermined magnetic flux density.

7. The extreme ultraviolet light generation apparatus according to claim 6, wherein the first region extends from one end part of a line orthogonal to the line along the magnetic field axis on the surface of the reflective layer to the other end part.

8. The extreme ultraviolet light generation apparatus according to claim 1, wherein two or more factors are selected from among four factors of a distance between the magnetic field axis and the surface of the reflective layer, a magnetic flux density of the magnetic field on the surface of the reflective layer, a distance between the focusing position of the laser beam and the surface of the reflective layer, and an angle between an optical axis of the laser beam and a line connecting the surface of the reflective layer and the focusing position of the laser beam, and the first region is defined based on the selected two or more factors.

9. The extreme ultraviolet light generation apparatus according to claim 1, wherein the first region is shifted, with respect to a line along the magnetic field axis on the surface of the reflective layer, in a direction of force that a charged particle generated through the plasma generation from the target substance receives from the magnetic field between the magnetic field axis and the condensing mirror.

10. The extreme ultraviolet light generation apparatus according to claim 1, wherein
the first protective layer contains $TiO_2$, and
the second protective layer contains at least one of TiN, $ZrO_2$, ZrN, $Nb_2O_5$, and $CeO_2$.

11. The extreme ultraviolet light generation apparatus according to claim 1, wherein
the first protective layer contains TiN, and
the second protective layer contains at least one of $ZrO_2$, ZrN, and $CeO_2$.

12. The extreme ultraviolet light generation apparatus according to claim 1, wherein
the first protective layer contains $ZrO_2$, and
the second protective layer contains at least one of $Nb_2O_5$ and ZrN.

13. The extreme ultraviolet light generation apparatus according to claim 1, wherein
the first protective layer contains $Nb_2O_5$, and
the second protective layer contains ZrN.

14. An extreme ultraviolet light generation apparatus comprising:
a chamber having an internal space in which a laser beam is condensed and plasma is generated from a target substance at a focusing position of the laser beam; and
a condensing mirror configured to condense extreme ultraviolet light generated through the plasma generation from the target substance,
the condensing mirror including a substrate, a reflective layer provided on the substrate to reflect the extreme ultraviolet light, and a protective layer provided on the reflective layer,
the protective layer including a first protective layer disposed in a first region within a predetermined range from a center of the condensing mirror, and a second protective layer disposed in a second region other than the first region on a surface of the reflective layer,
a material of the first protective layer being less dense than a material of the second protective layer,
the second protective layer having a transmittance for the extreme ultraviolet light higher than a transmittance for the extreme ultraviolet light of the first protective layer.

15. The extreme ultraviolet light generation apparatus according to claim 14, wherein the first region has a rotationally symmetric shape with respect to the center of the condensing mirror.

16. The extreme ultraviolet light generation apparatus according to claim 14, wherein the second protective layer is disposed between the reflective layer and the first protective layer in the first region.

17. The extreme ultraviolet light generation apparatus according to claim 14, wherein the first region is a region in which a distance between the focusing position of the laser beam and the surface of the reflective layer is equal to or shorter than a predetermined distance.

18. The extreme ultraviolet light generation apparatus according to claim 14, wherein the first region is a region in which an angle between an optical axis of the laser beam and a line connecting the surface of the reflective layer and the focusing position of the laser beam is equal to or smaller than a predetermined angle.

19. An electronic device manufacturing method comprising:
generating extreme ultraviolet light with an extreme ultraviolet light generation apparatus;
outputting the extreme ultraviolet light to an exposure apparatus; and
exposing a photosensitive substrate to the extreme ultraviolet light in the exposure apparatus to manufacture an electronic device, the extreme ultraviolet light generation apparatus including a chamber having an internal space in which a laser beam is condensed and plasma is generated from a target substance at a focusing position of the laser beam, a condensing mirror configured to condense extreme ultraviolet light generated through the plasma generation from the target substance, and a magnetic field generation unit configured to generate a magnetic field having a magnetic field axis intersecting a reflected light path of the condensing mirror, the condensing mirror including a substrate, a reflective layer provided on the substrate to reflect the extreme ultraviolet light, and a protective layer provided on the reflective layer, the protective layer including a first protective layer disposed in a first region including at least part of a line extending through a center of the condensing mirror along the magnetic field axis on a surface of the reflective layer, and a second protective layer disposed in a second region other than the first region on the surface of the reflective layer, a material of the first protective layer being less dense than a material of the second protective layer, the second protective layer having a transmittance for the extreme ultraviolet light higher than a transmittance for the extreme ultraviolet light of the first protective layer.

20. An electronic device manufacturing method comprising:

generating extreme ultraviolet light with an extreme ultraviolet light generation apparatus;

outputting the extreme ultraviolet light to an exposure apparatus; and exposing a photosensitive substrate to the extreme ultraviolet light in the exposure apparatus to manufacture an electronic device, the extreme ultraviolet light generation apparatus including a chamber having an internal space in which a laser beam is condensed and plasma is generated from a target substance at a focusing position of the laser beam, and a condensing mirror configured to condense extreme ultraviolet light generated through the plasma generation from the target substance, the condensing mirror including a substrate, a reflective layer provided on the substrate to reflect the extreme ultraviolet light, and a protective layer provided on the reflective layer, the protective layer including a first protective layer disposed in a first region within a predetermined range from a center of the condensing mirror, and a second protective layer disposed in a second region other than the first region on a surface of the reflective layer, a material of the first protective layer being less dense than a material of the second protective layer, the second protective layer having a transmittance for the extreme ultraviolet light higher than a transmittance for the extreme ultraviolet light of the first protective layer.

* * * * *